(12) United States Patent
Martin et al.

(10) Patent No.: US 9,689,524 B2
(45) Date of Patent: Jun. 27, 2017

(54) PLIABLE MEMBER PANEL SUPPORT

(71) Applicant: Hewlett-Packard Development Company, L.P., Houston, TX (US)

(72) Inventors: Randall W. Martin, The Woodlands, TX (US); Matthew Leck, Fort Collins, CO (US); Stephen de Saulles, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 47 days.

(21) Appl. No.: 14/414,116

(22) PCT Filed: Oct. 31, 2012

(86) PCT No.: PCT/US2012/062722
§ 371 (c)(1),
(2) Date: Jan. 11, 2015

(87) PCT Pub. No.: WO2014/070157
PCT Pub. Date: May 8, 2014

(65) Prior Publication Data
US 2015/0211676 A1    Jul. 30, 2015

(51) Int. Cl.
| A47G 29/00 | (2006.01) |
| F16M 11/20 | (2006.01) |
| G06F 1/16 | (2006.01) |
| A45C 13/10 | (2006.01) |
| A45C 13/34 | (2006.01) |
| A47G 1/16 | (2006.01) |
| H05K 5/00 | (2006.01) |
| H05K 5/02 | (2006.01) |

(52) U.S. Cl.
CPC ......... *F16M 11/2021* (2013.01); *A45C 13/10* (2013.01); *A45C 13/34* (2013.01); *A47G 1/16* (2013.01); *G06F 1/1601* (2013.01); *H05K 5/0017* (2013.01); *H05K 5/0234* (2013.01); *G06F 2200/1631* (2013.01)

(58) Field of Classification Search
CPC ......... G06F 1/161; A45C 13/10; A45C 13/34; F16M 11/2021; H05K 5/0017
USPC .............................................. 248/371, 372.1
See application file for complete search history.

(56) References Cited

U.S. PATENT DOCUMENTS 6,016,248 A    1/2000  Anzai et al.
6,570,627 B1 *  5/2003  Chang ................... F16M 11/10
                                                    248/917

(Continued)

FOREIGN PATENT DOCUMENTS

JP        07-261673       10/1995

OTHER PUBLICATIONS

"Apple Designs a Future Built-in Stand for the iPad & More"; Feb. 3, 2011; 9 pages.

(Continued)

*Primary Examiner* — Todd M Epps
(74) *Attorney, Agent, or Firm* — Rathe Lindenbaum LLP

(57) ABSTRACT

A panel support (24, 424, 824) comprises an arm (26, 826) having a first portion coupled to a panel (22, 422, 822) and a second portion movable to an extended panel supporting position. A pliable member (28, 828) extends from the panel (22, 422, 822) and is coupled to the arm (26, 826). The pliable member (28, 828) is maintained in tension despite movement of the arm (26, 826).

14 Claims, 18 Drawing Sheets

(56) References Cited

U.S. PATENT DOCUMENTS

| | | | |
|---|---|---|---|
| 7,293,747 B2 * | 11/2007 | Wang | F16M 11/10 248/125.2 |
| 8,474,609 B1 * | 7/2013 | Hong | A45C 11/00 206/320 |
| 2005/0121594 A1 | 6/2005 | Kuo | |
| 2007/0211420 A1 | 9/2007 | Bang | |
| 2011/0290970 A1 | 12/2011 | Fan | |
| 2012/0037523 A1 | 2/2012 | Diebel et al. | |
| 2012/0044638 A1 | 2/2012 | Mongan et al. | |
| 2012/0120628 A1 | 5/2012 | Bliven et al. | |
| 2012/0261304 A1 | 10/2012 | Busri | |
| 2015/0211676 A1 * | 7/2015 | Martin | G06F 1/1601 361/679.01 |

OTHER PUBLICATIONS

Hilal, A.; "ASUS Transformer AiO with Dual Boot—Windows and Android"; Jul. 4, 2012; 3 pages.

Lynch, G.; "AOC 16 Inch Portable PC Monitor is Powered by USB Alone"; Sep. 21, 2011; 7 pages.

* cited by examiner

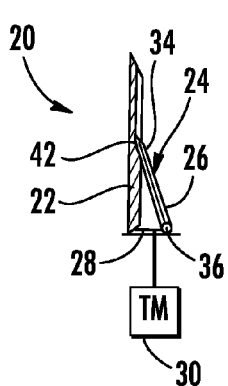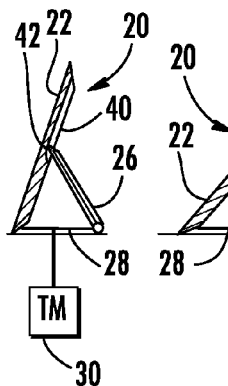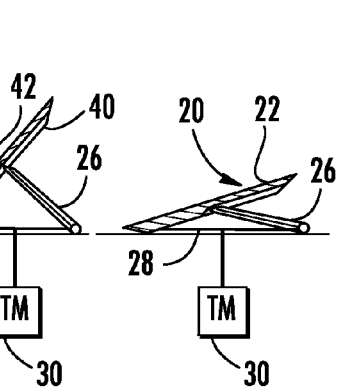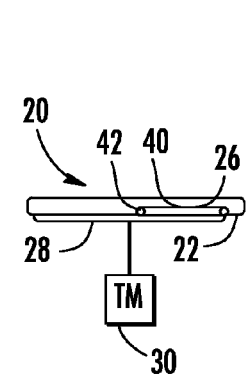
FIG. 1   FIG. 2   FIG. 3   FIG. 4   FIG. 5
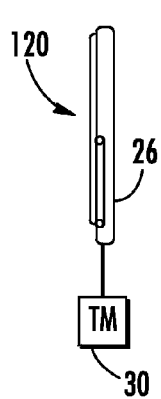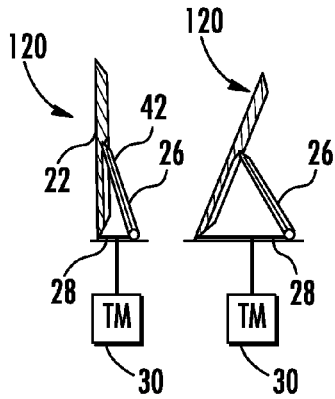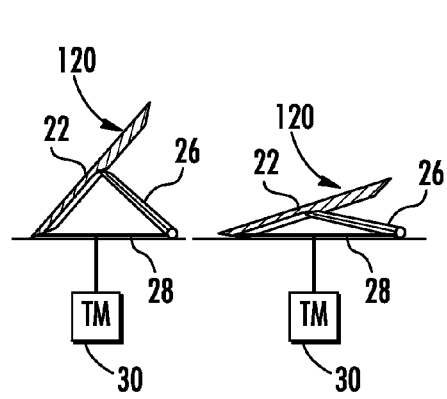
FIG. 6   FIG. 7   FIG. 8   FIG. 9   FIG. 10
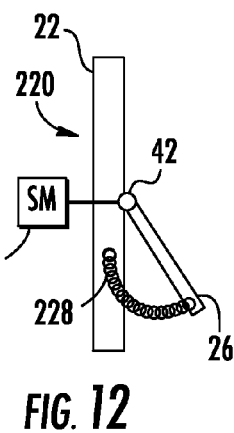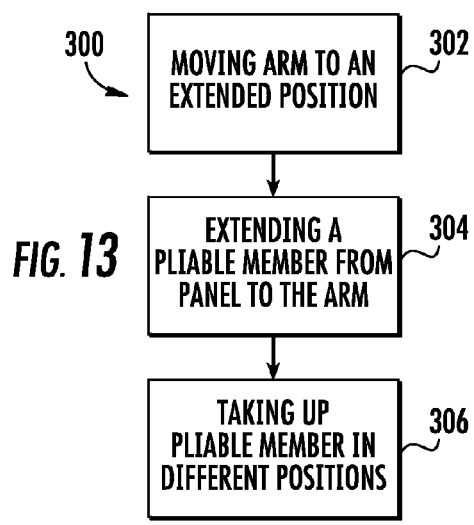
FIG. 11   FIG. 12   FIG. 13

PLIABLE MEMBER PANEL SUPPORT

BACKGROUND

Displays, frames and images are sometimes supported by easel style mechanisms. Although some easel style mechanisms recline to provide different tilt angles, the number of tilt angles is limited. Reclining such easel style mechanisms may also be difficult and may not be intuitive.

BRIEF DESCRIPTION OF THE DRAWINGS

FIGS. 1-5 are side views schematically illustrate an example panel support system supporting a panel in various example tilt orientations.

FIGS. 6-10 are side views schematically illustrating another example panel support system supporting a panel in various example tilt orientations.

FIGS. 11 and 12 are side views schematically illustrating another example panel support system supporting a panel in the example tilt orientations.

FIG. 13 is a flow diagram of an example method that may be carried out by any of the panel support systems of FIGS. 1-12.

DETAILED DESCRIPTION OF THE EXAMPLE EMBODIMENTS

Figure 14:
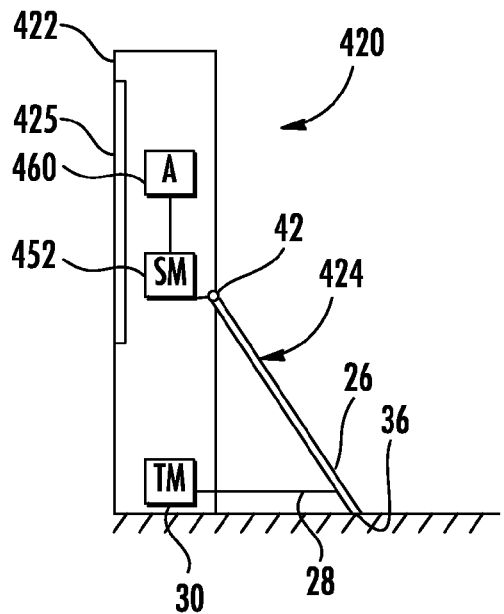
FIG. 14 is a side view schematically illustrating another example panel support system supporting a panel in an example tilt orientation.

FIGS. 1-5 schematically illustrate a panel support apparatus or system 20 in various panel supporting tilt positions. As will be described hereafter, panel support system 20 supports a panel 22 at a tilt position selected from a wide range of possible tilt positions. The adjustment of the tilt angle or tilt position of panel 22 of support system 22 may be carried out in an intuitive manner.

Panel support system 20 comprises panel 22 and support 24. Panel 22 comprises a generally planar member configured to rest on its lower edge upon a support surface and to be supported at a tilted angle by support 24 while in a vertical tilted orientation. In one implementation, panel 22 may comprise a shelf or back panel against which or upon which a frame, sheet, canvass, poster or electronic display device may rest. Examples of electronic display device which may be supported by panel 22 include, not limited to, monitors, tablet computers, personal data assistants, and the like. The displays of such electronic display devices may utilize a touchscreen or may utilize external input devices.

In other implementations, panel 22 may itself incorporate an electronic display device. For example, panel 22 may be part of the housing having a display portion in the form of a screen. The electronic display device may merely be a monitor, wherein processors communicate with the electronic display device and the panel. In other implementations, the electrical display device incorporated in the panel may include a processor. In some implementations, the electronic display device may include a touchscreen to facilitate input.

Support 24 supports panel 22 at a selected one of a plurality of different orientations or tilt angles. In the example illustrated, support 24 is retractable to a substantially collapsed or retracted position, wherein support 24 extends substantially parallel to the plane of panel 22, allowing panel 20 to vertically stand on a support or to horizontally rest on a flat surface in a flat orientation. Support 24 comprises arm 26, pliable member 28 and take-up mechanism 30.

Arm 26 comprises a rigid member movably coupled to panel 22. For purposes of this disclosure, the term "coupled" shall mean the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. The term "operably coupled" shall mean that two members are directly or indirectly joined such that motion may be transmitted from one member to the other member directly or via intermediate members. The term "movably coupled" means that one member is directly or indirectly supported by the other member to allow movement of the one member.

Arm 26 is coupled to panel 22 so as to be movable between a retracted position and multiple extended positions. In the example illustrated, arm 26 has an upper first portion 34 pivotably connected to a back or rear of panel 22 and a lower end or foot 36 to rest upon a support surface. In the example illustrated, arm 26 is configured to nest within a cavity or recess 40 when in a fully retracted position (shown in FIG. 5). In other implementations, arm 26 may merely abut or extend parallel to a rear of panel 22.

Pliable member 28 comprises a pliable structure or link extending from panel 22 and coupled to arm 26. For purposes of this disclosure, the term "pliable" shall mean a structure formed from one or more materials and having dimensions that allow the structure to bend at least 45 degrees and nominally at least 180 degrees. In one implementation, the structure is bendable such that the structure may be wound or coiled with portions of the structure at least partially overlapping with respect to an axis about which the structure winds. In one implementation, the structure is not stretchable. In another implementation, the structure is resiliently stretchable or resiliency flexible. In one implementation, pliable member 28 comprises a strap, band or belt having a width with a major dimension and a much smaller thickness. In another implementation, pliable member 28 may comprise a structure having a symmetrical cross-section (square, circular) such as a cable, line, wire and the like.

In the example illustrated, pliable member 28 extends from panel 22 and is connected to arm 26 proximate to foot 36. In one implementation, pliable member 28 extends from an interior of panel 22. In another implementation, pliable member 28 extends from an interior of arm 26. Pliable member 28 has a sufficient length to allow arm 26 to pivot to the fully retracted position (shown in FIG. 5) where pliable member 28 extends across the pivot axis 42 of arm 26 from below axis 42 to above axis 42 when panel 20 supported by arm 26 in one of the vertical orientation shown in FIGS. 1-4. In other implementations, pliable member 28 may have other lengths.

Take-up mechanism 30 comprises a mechanism configured to take-up extra length of pliable member 28 and to take-up pliable member 28 such that pliable member 28 is taut in each of the extended positions of arm 26 at each of the vertical support or tilt orientations of panel 22. Because pliable member 20 is automatically taken up in response to repositioning of arm 26 to support panel 22 at different tilt angles or orientations, arm 26 may be easily adjusted while arm 26 continues to receive support from pliable member 28. In one implementation, take-up mechanism 30 is carried by panel 22. In one implementation, take-up mechanism 30 may be housed within an interior of panel 22. In another implementation, take-up mechanism 30 may be carried by or housed within arm 26. In one implementation, take-up mechanism 30 comprises one or more shafts about which pliable member 28 winds, wherein a bias, such as a torsion spring, applies a torque to the shaft to urge rotation of the shaft and urge winding a pliable member 28. In other implementations, take-up mechanism 28 may comprise other mechanisms.

As shown by FIGS. 1-4, arm 26 may be rotated in a counter-clockwise direction about axis 42 so as to support panel 22 at an ever-increasing angular orientation until arm 26 is substantially parallel to panel 22 as shown in FIG. 5. In the example illustrated, arm 26 may be positioned at a continuum of locations to support panel 22 at a continuum of orientations. When the orientation of panel 22 is adjusted to a more vertical orientation where the length of pliable member 28 between panel 22 and arm 26 become shorter, take mechanism 30 takes up the excess extent or length of pliable member 28. In one implementation, support 24 additionally includes a bias that resiliently urges arm 26 in the counterclockwise direction, resiliently urging the extension of pliable member 28 from panel 22.

FIGS. 6-10 schematically illustrate panel support system 120, an alternative example implementation of system 20. Panel support system 120 is similar to panel support system 20 except that arm 26 is in the most retracted position (most parallel to or nested within the back of panel 22) when the extent to which pliable member 28 extends from panel 22 is shortest. This is an direct contrast to system 20 where the extent to which pliable member 28 extends from panel 22 is greatest when arm 26 is in the most retracted position. Those components of system 120 which correspond to components of system 20 are numbered similarly.

FIGS. 11 and 12 schematically illustrate panel support system 220, another alternative example implementation of system 20. System 220 is similar to systems 20 and 120 except that system 220 includes a pliable member 228 which serves as a take-up mechanism and that system 220 additionally includes a pliable member securement mechanism 248. Those remaining components of system 220 which correspond to components of systems 20 and 120 are numbered similarly.

Pliable member 228 similar to pliable member 28 except that pliable member 228 is itself resiliently or elastically extendable or stretchable. In one implementation, pliable member 228 may comprise any elastic rubber or rubber-like cord. Because the end of member 228 is contained within an interior of panel 22, the resilient stretchability or elasticity of member 228 enables member 228 to be automatically taken-up as arm 26 is moved between different panel supporting positions. Pliable member 228 is taken up to the interior of panel 22 such that slack does not interfere with the ability of arm 26 to be positioned against or nested within panel 22, increasing compactness and facilitating use of panel 22 in a flat horizontal orientation. In other implementations, the end of member 228 is contained within an interior of arm 26 such that pliable member 228 may be taken up within an interior of arm 26.

Because member 228 is constantly attempting to retract arm 26 towards the retracted or nested position, system 220 additionally includes securement mechanism 248. Securement mechanism 248 comprises a mechanism which secures pliable member 228 against length shortening. In the example illustrated, securement mechanism 248 inhibits rotation of arm 26 in a clockwise direction (as seen in FIGS. 11 and 12) towards the retracted position. In one implementation, securement mechanism 248 may comprise a latch. In another implementation, securement mechanism 248 may comprise a manually actuatable brake that is resiliently biased to the braking position. Although the example illustrates the extent to which pliable member 228 extends from panel 22 being shortest when arm 26 is in the most retracted position (similar to system 120), in other implementations, 220 may operate in a fashion more akin to system 20, wherein the extent to which follow member 228 extends from panel 22 is greatest when arm 26 is in the retracted position.

FIG. 13 is a flow diagram of an example method 300 that may be carried out using any of systems 20, 120 or 220. As indicated by step 302, arm 26 is moved to an extended position. Examples of various extended positions are shown in FIG. 1-4 or 7-10. As indicated by step 304, pliable member 28 (or 228) is extended from panel 22 to arm 26. As indicated by step 306, in each of the different selectable continuously variable positions for arm 26, pliable member 28 is taken up. As noted above, pliable member 28 may be taken up by a dedicated take-up mechanism 30 or may be taken up by the elastic nature of pliable member 228 and the positioning of a sufficient portion of pliable member 228 within an interior of panel 22 (or arm 26) to allow the length of pliable member 228 to be substantially or completely contained within the interior of panel 22 (or arm 26).

FIG. 14 schematically illustrates panel support system 420, another example implementation of panel support system 20. Panel support system 420 comprises panel 422 and support 424. Panel 422 is similar to panel 22 except that panel 422 is specifically illustrated as additionally comprising a display portion 425. Display portion 425 comprise an electronic display device houses part of panel 42. In one Implementation, display portion 425 may comprise a screen. In one implementation, display portion 425 may comprise a touch screen. In one implementation, panel 422 may additionally house a processor, wherein panel 422 may comprise an all-in-one computing device. In another implementation, the processor may be externally located and may communicate with display portion 425. In some implementations, display portion 425 may be omitted.

Support 424 is similar to support 24 except that support 424 comprises pliable member securement mechanism 452 and actuator 460. Those remaining components of support 424 which correspond to components of support 24 are numbered similarly. Pliable member securement mechanism 452 comprises a mechanism to secure pliable member 28 against actuation from a shortened position to a lengthened position. In other words, pliable securement mechanism 452 inhibits counterclockwise rotation of arm 26 (as seen in FIG. 14).

In one implementation, pliable securement mechanism 452 additionally includes a dampener to inhibit clockwise rotation of arm 26 when actuated. In one implementation, support 420 additionally comprises a bias (such as a torsion spring coupled to arm 26) for resiliently urging arm 26 in a counterclockwise direction about axis 42, against the pulling force of take-up mechanism 30, wherein securement mechanism 452 secures arm 26 against pivotal movement in both directions. In one implementation, pliable securement mechanism 452 comprises a brake mechanism applying a frictional braking force against a shaft along axis 42 and about which arm 26 pivots. Pliable securement mechanism 452 is resiliently biased towards an arm securing position.

Actuator 460 comprises a device coupled to securement mechanism 452 so as to move securement mechanism 452 to a releasing position, allowing arm 26 to be rotated counterclockwise against the bias of take-up mechanism 30. In one implementation, actuator 460 comprise a manual actuator such as a lever, paddle or other structure configured to be manually pushed or pulled. In operation, actuator 460 is actuated as arm 26 is extended either in response to manually applied force, the force applied by a bias (such as a torsion spring) or a combination thereof, and as take-up mechanism 30 automatically takes-up pliable member 28. Once arm 26 has been extended to a desired position such that panel 422 is supported at a desired tilt angle, actuator 460 may be released, allowing securement mechanism 452 to retain arm 26 in the desired position.

Figure 15:
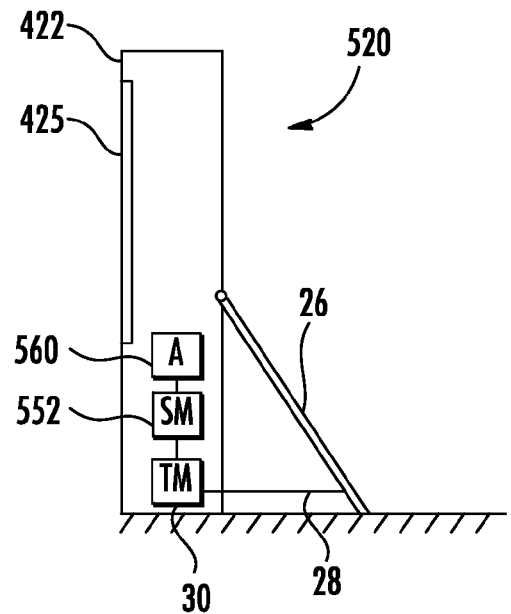
FIG. 15 is a side view schematically illustrating another example panel support system supporting a panel in an example tilt orientation.

FIG. 15 schematically illustrates panel support system 520, another example implementation of panel support system 20. Panel support system 520 is similar to panel support system 420 except that support system 520 comprises pliable member securement mechanism 552 and actuator 560 in place of securement mechanism 452 and actuator 460, respectively. Those remaining components of system 520 that correspond to components of system 420 are numbered similarly.

Pliable member securement mechanism 552 is operably coupled to pliable member 28 to resist or inhibit extension of pliable member 28 from panel 422. In one implementation, mechanism 552 further inhibits retraction of pliable member 28 into panel 422. For example, in one implementation, take-op mechanism 30 may comprise a torsion spring that resiliently urges a shaft to wind up pliable member 28. Securement mechanism 552 may comprise a pinching mechanism that pinches pliable member 28 to frictionally retain pliable member 28 against such extension or retraction. In one implementation, the pinching force applied to the pliable member 28 increases as greater counter clockwise torque is applied to arm 26.

Actuator 560 comprises a device coupled to securement mechanism 552 so as to move secure mechanism 452 to a releasing position, allowing pliable member 28 to be extended or retracted, wherein take-up mechanism 30 may retract pliable member 28 or wherein arm 26 may be extended against the bias of take-up mechanism 30. As noted above, in one implementation, the extension of arm 26 may be assisted by an additional bias which resiliently urges arm 26 in a counter-clockwise direction as seen in FIG. 15.

In one implementation, actuator 460 comprise a manual actuator such as a lever, paddle or other structure configured to be manually pushed or pulled. In operation, actuator 560 is actuated as arm 26 is extended either in response to manually applied force (indirectly from the supporting surface as the support angle of arm 26 is adjusted), the force applied by a bias (such as a torsion spring) or a combination thereof, and as take-up mechanism 30 automatically takes-up pliable member 28. Once arm 26 has been extended to a desired position such that panel 422 is supported at a desired tilt angle, actuator 460 may be released, allowing securement mechanism 452 to retain pliable member 28 such that arm 26 is also retained in the desired position.

Figure 16:
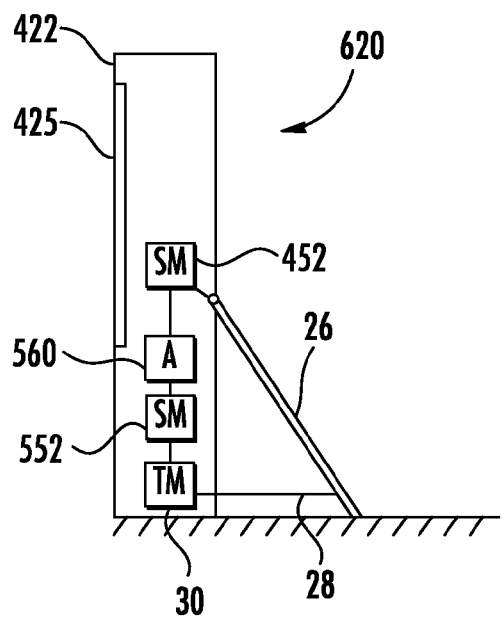
FIG. 16 is a side view schematically illustrating another example panel support system supporting a panel in an example tilt orientation.

FIG. 16 schematically illustrates panel support system 620, another example implementation of panel support system 20. Panel support system 620 is similar to panel support system 520 except that system 620 additionally comprises pliable securement mechanism 452 described with respect to system 420, wherein actuator 560 is additionally operably coupled to securement mechanism 452. In operation, actuation of actuator 560 releases both securement mechanism 452 and securement mechanism 552, allowing arm 26 to be rotated. Once arm 26 is in a desired position and panel 422 is in a desired tilt orientation, actuator 560 may be released, causing securement mechanisms 452 and 552 to inhibit rotation of arm 26 and extension/retraction of pliable member 28.

Figure 17:
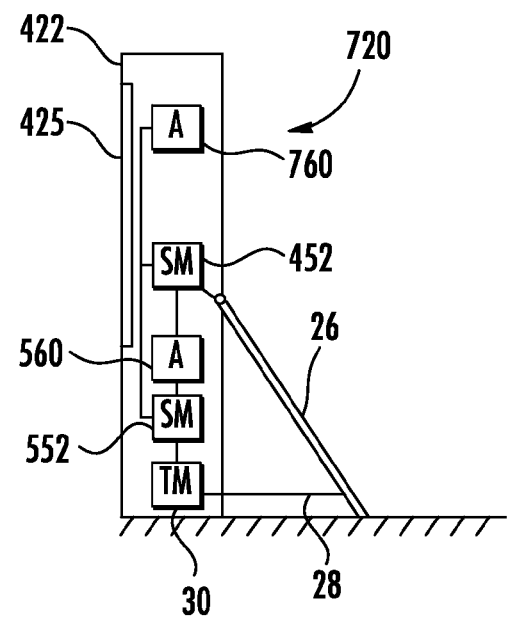
FIG. 17 is a side view schematically illustrating another example panel support system supporting a panel in an example tilt orientation.

FIG. 17 schematically illustrates panel support system 720, another example implementation of panel support system 20. Panel support system 720 is similar to panel support system 620 except that panel support system 720 additionally comprises actuator 760. Those remaining components of system 720 which correspond to components of system 620 are numbered similarly. Actuator 760 is similar to actuator 560 except that actuator 760 is located at a distinct position or location along panel 422. Like actuator 560, actuator 760 facilitates actuation of securement mechanisms 452 and 552 to releasing positions, allowing arm 26 to be repositioned. In the example illustrated, either or both of actuators 560, 760 may be actuated to release both of mechanisms 452, 552 for adjusting the positioning of arm 26. The different locations of actuators 560, 760 enhance usability and ease of adjustment for system 720.

Figure 18:
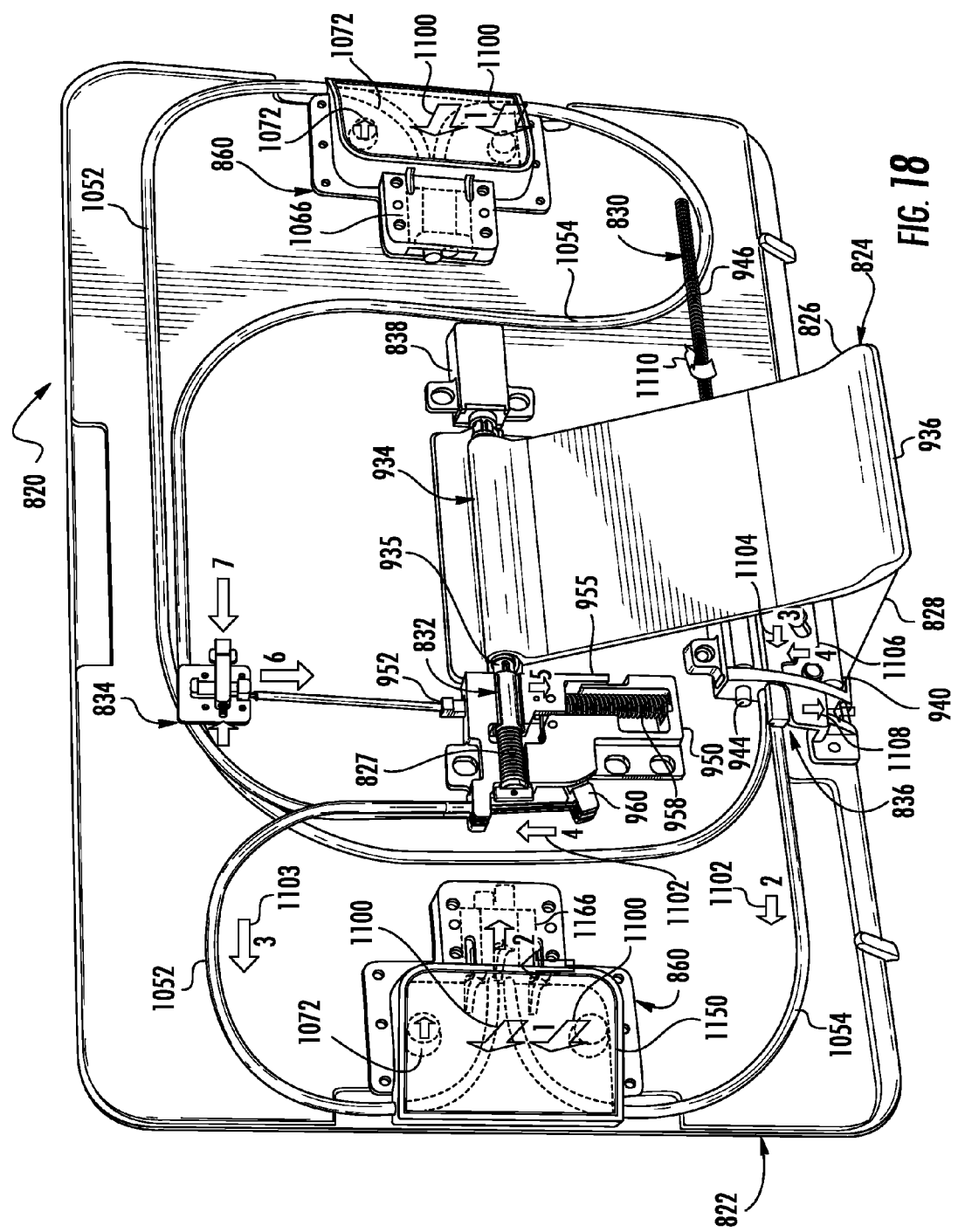
FIG. 18 is a rear perspective view of another example implementation of the panel support system of FIG. 1 supporting a panel in an example tilt orientation.

FIG. 18 is a perspective view illustrating panel support system 820, an example implementation of panel support system 20. Panel support system 820 comprises panel 822 and support 824. Panel 822 is similar to panel 422 in that panel 822 comprises a display portion 425 (shown in FIGS. 14-17). In other implementations, panel 822 may omit display portion 425 and be configured to support an independent electronic display device, frame, poster, canvas or the like.

Support 824 supports panel 822 at a selected one of a plurality of continuously variable different orientations or tilt angles. In the example illustrated, support 824 is retractable to a substantially collapsed or retracted position, wherein support 824 extends substantially parallel to the plane of panel 822, allowing panel 822 to horizontally rest on a flat surface in a flat orientation. Support 824 comprises arm 826, bias 827, pliable member 828, take-up mechanism 830, securement mechanism 832, securement mechanism 834, securement mechanism 836, dampener 838 and actuators 860.

Arm 826 comprises a rigid member movably coupled to panel 822. Arm 826 is coupled to panel 822 so as to be movable between a retracted position and multiple extended positions. In the example illustrated, arm 826 has an upper first portion 934 pivotably connected to a back or rear of panel 822 and a lower end or foot 936 to rest upon a support surface. In particular, upper portion 934 is fixed to axle shaft 935 which is rotationally journaled at opposite ends by securement mechanism 832 and dampener 838. In the example illustrated, arm 826 is configured to nest within a cavity or recess 939 (shown in FIG. 31) when in a fully retracted position. In other implementations, arm 26 may merely abut or extend parallel to a rear of panel 822.

Bias 827 comprises a torsion spring coupled to arm 826 to resiliently bias arm 826 towards an extended state (clockwise rotation as seen in FIG. 18). Bias 827 assists in the retraction of pliable member 828. Bias 828 applies a force that is less than the force of take up mechanism 830 to maintain pliable member 828 in tension. In other implementations, bias 827 may be omitted.

Pliable member 828 comprises a pliable structure or link extending from panel 822 and coupled to arm 826. In the example illustrated, pliable member 828 comprises a strap, band or belt having a width with a major dimension and a much smaller thickness. In another implementation, pliable member 828 may comprise a structure having a symmetrical cross-section (square, circular) such as a cable, line, wire and the like.

In the example illustrated, pliable member 828 extends from panel 822 and is connected to arm 826 proximate to foot 936. In the example illustrated, pliable member 828 extends from an interior of panel 22, wherein back plate 941 (shown in FIGS. 31-33) conceals many of the components of support 824, allowing arm 826 and pliable member 828 to extend from the back plate 941. Pliable member 828 has a sufficient length to allow arm 826 to pivot to the fully retracted position shown in FIG. 31 where pliable member 828 extends across the pivot axis 942 of arm 826 from below axis 942 to above axis 942 when panel 822 is supported by arm 826 in one of the vertical orientations such as exemplified in FIGS. 1-4. In other implementations, pliable member 828 may have other lengths.

Take-up mechanism 830 comprises a mechanism configured to take-up extra length of pliable member 828 and to take-up pliable member 828 such that pliable member 828 is taut in each of the extended positions of arm 826 at each of the vertical support or tilt orientations of panel 822. Because pliable member 828 is automatically taken up in response to repositioning of arm 826 to support panel 822 at different tilt angles orientations, arm 826 may be easily adjusted while arm 826 continues to receive support from pliable member 828. In one implementation, take-up mechanism 30 is carried by panel 22. In the example illustrated, take-up mechanism 830 is housed within an interior of panel 822. In the example illustrated, take-up mechanism 830 comprises one or more guide shafts 940, 942 (shown in FIGS. 24 and 25), a shaft or roller spool 944 about which pliable member 828 winds, and a bias 946, such as a torsion spring, that applies a torque to the spool 944 to urge rotation of the spool 944 and urge winding of pliable member 828. In other implementations, take-up mechanism 830 may comprise other mechanisms.

Figure 19:
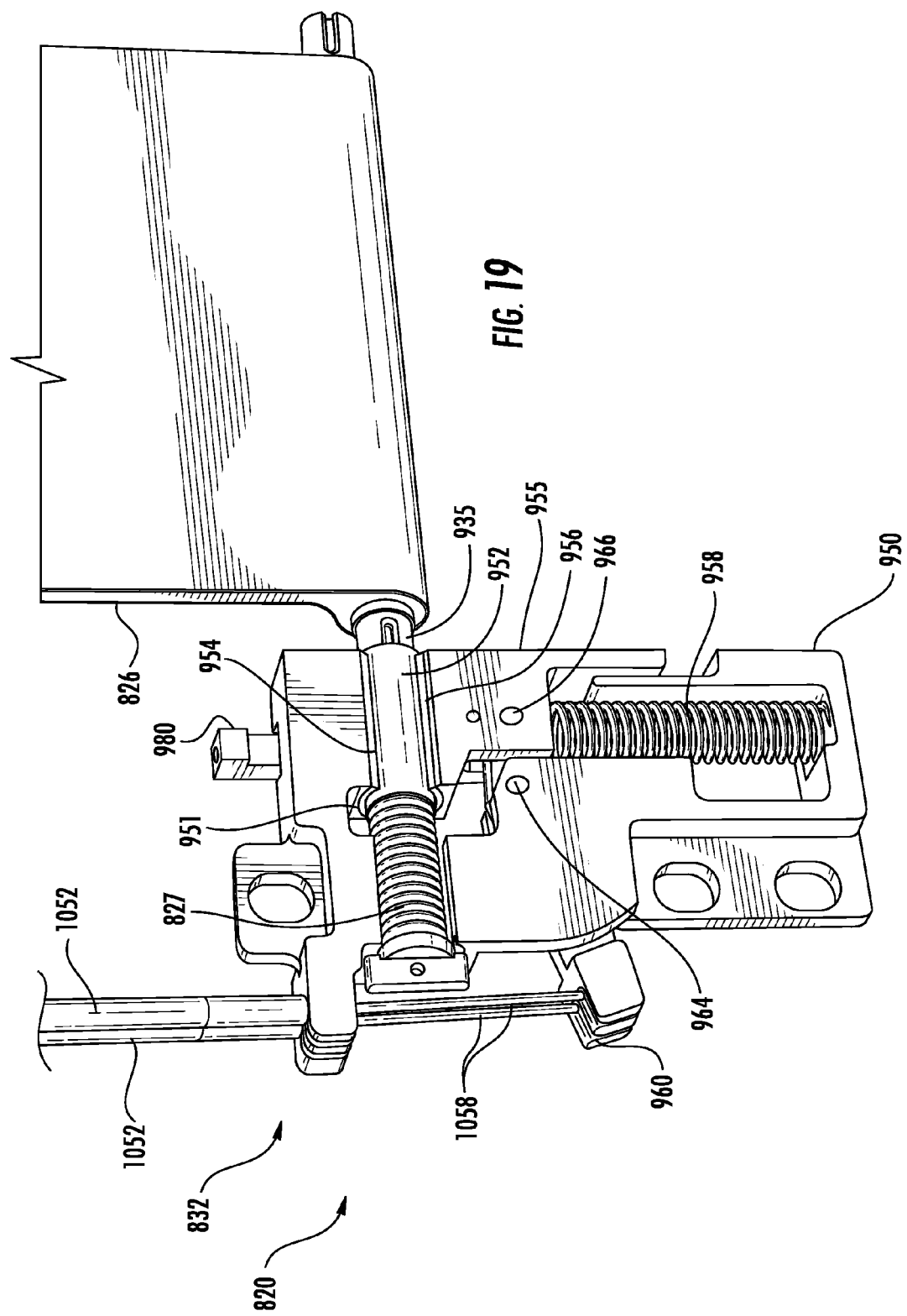
FIG. 19 is a perspective view of an example first securement mechanism of the system of FIG. 18 in a braking or securing state.
Figure 20:
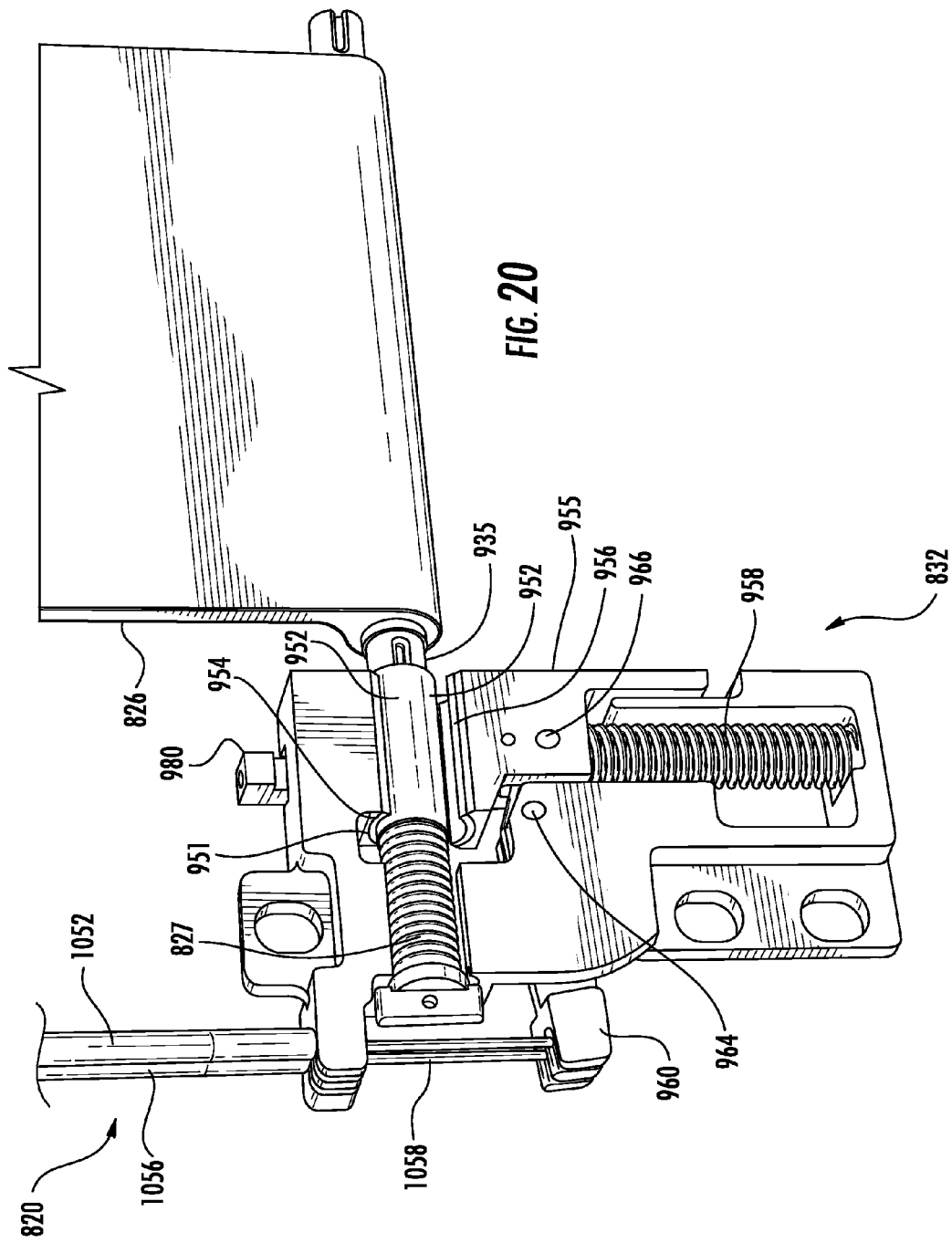
FIG. 20 is a perspective view of the first securement mechanism of FIG. 19 in a released state.

Securement mechanism 832 comprises a brake subassembly configured to brake rotation of axle shaft 935 and rotation of arm 826. FIGS. 19 and 20 illustrate securement mechanism 832 in detail. FIG. 19 illustrates securement mechanism 832 in a braking state. FIG. 20 illustrates securement mechanism 822 in a brake released state. As shown by FIG. 19, securement mechanism 832 comprises body 950, sleeve 952, upper brake pad 954, lower brake pad support 955, lower brake pad 956, bias 958 and lever arm 960.

Body 950 comprises a frame, housing or bracket supporting the remaining components of securement mechanism 832. Body 950 forms a passage 951 through which shaft 935 (or an extension from shaft 935) extends. Body 950 further movably guides and supports lower brake pad 956 and lever 960. In other implementations, body 950 may have other configurations.

Sleeve 952 comprises a tabular member fixed or non-rotationally coupled to shaft 935 so as to rotate with rotation of shaft 935. Sleeve 952 is formed from a material configured to have a high coefficient of friction with respect to those portions of upper brake pad 954 and lower brake pad 956 with which sleeve 952 interacts. In other implementations, sleeve 952 may have shapes other than a cylinder. In other implementations, sleeve 952 may be omitted, wherein pads 954, 956 directly interact with post 935.

Upper brake pad 954 comprises an arcuate member formed from a material having a high coefficient of friction with sleeve 952. Upper brake pad 954 is fixed and supported by body 950 along passage 951. Lower brake pad support 955 comprise a member movably supported and guided by body 950 and operably coupled to lever 960. Lower brake pad support 955 supports lower brake pad 956. Lower brake pad 956 comprises an arcuate member movably supported along passage 951 opposite to upper brake pad 954. Lower brake pad 956 is formed from a material having a high coefficient of friction with sleeve 952.

Bias 958 comprises a compression spring operably coupled between body 950 and lower brake pad 956. Bias 956 resiliently biases support 955 and lower brake pad 956 towards upper brake pad 954 and towards a braking position in which rotation of sleeve 952 and arm 826 is hindered or inhibited. In other implementations, bias 958 may comprise other bias mechanisms, such as other forms of springs operably coupled to one or both of pads 954, 956.

Lever 960 comprises a lever arm pivotably supported by body 950 for rotation about axis 964 and further pivotably coupled to support 955 by pin 966. Lever 960 is operably connected to each of actuators 860, allowing either of actuators 860 to pull lever 960 against the bias force of bias 958 to move support 955 and brake pad 956 out of the braking position. FIG. 20 illustrates the pulling of lever 960 against bias 958 to withdraw or brake support 956 out of contact with sleeve 952, allowing sleeve 952, shaft 935 and arm 826 to rotate under the force of bias 827. In other implementations, one or both of brake pads 954, 956 may be actuated between a braking position and a brake release position using other actuation mechanisms.

Securement mechanism 834 comprise a mechanism configured to secure and retain arm 826 in a fully retracted position. As noted above, in the example illustrated, in such a fully retracted position, arm 826 nests within a cavity a recess along a back of panel 822. In the example illustrated, securement mechanism 834 comprises a catch subassembly.

Figure 21:
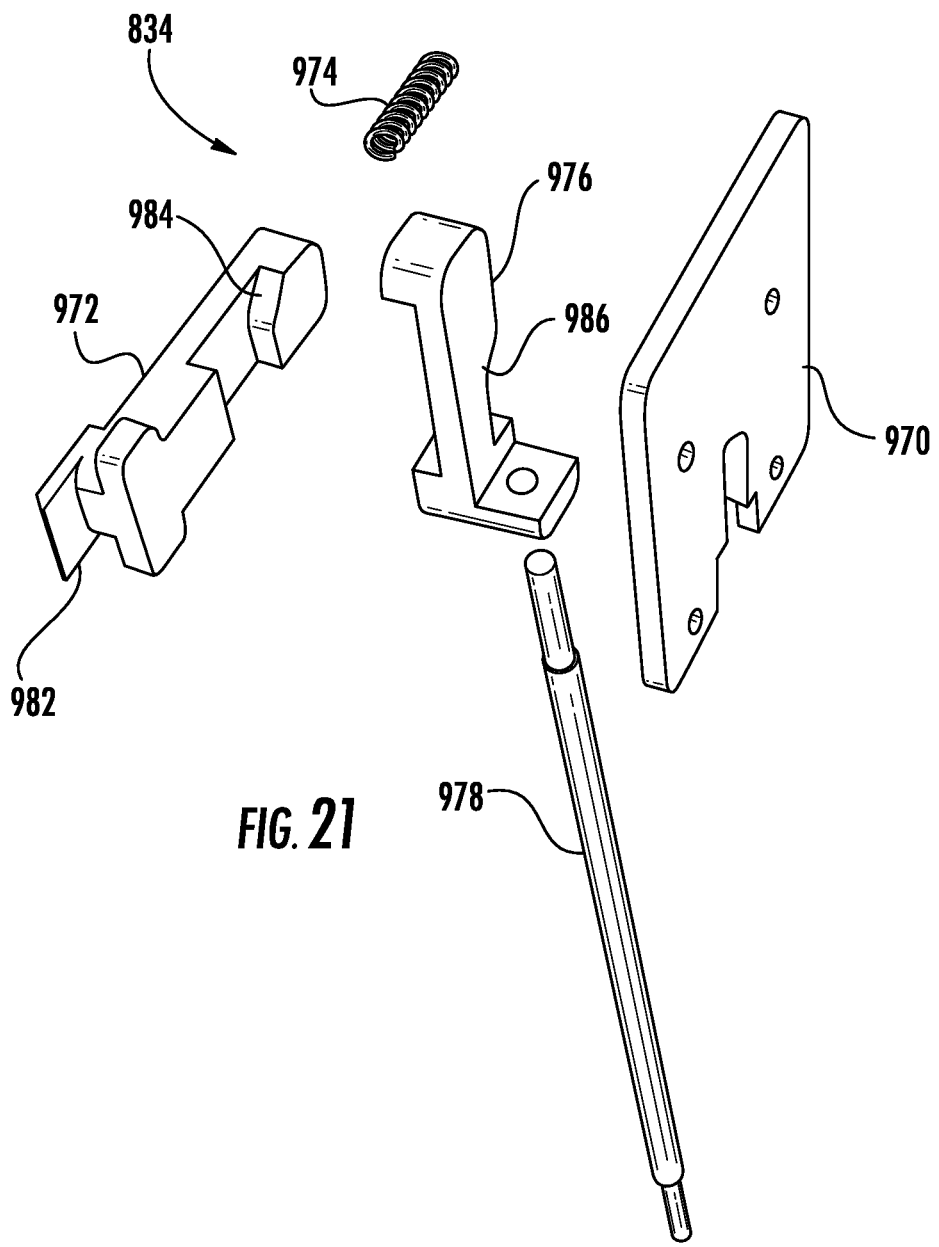
FIG. 21 is an exploded perspective view of an example second securement mechanism of the system of FIG. 18.
Figure 22:
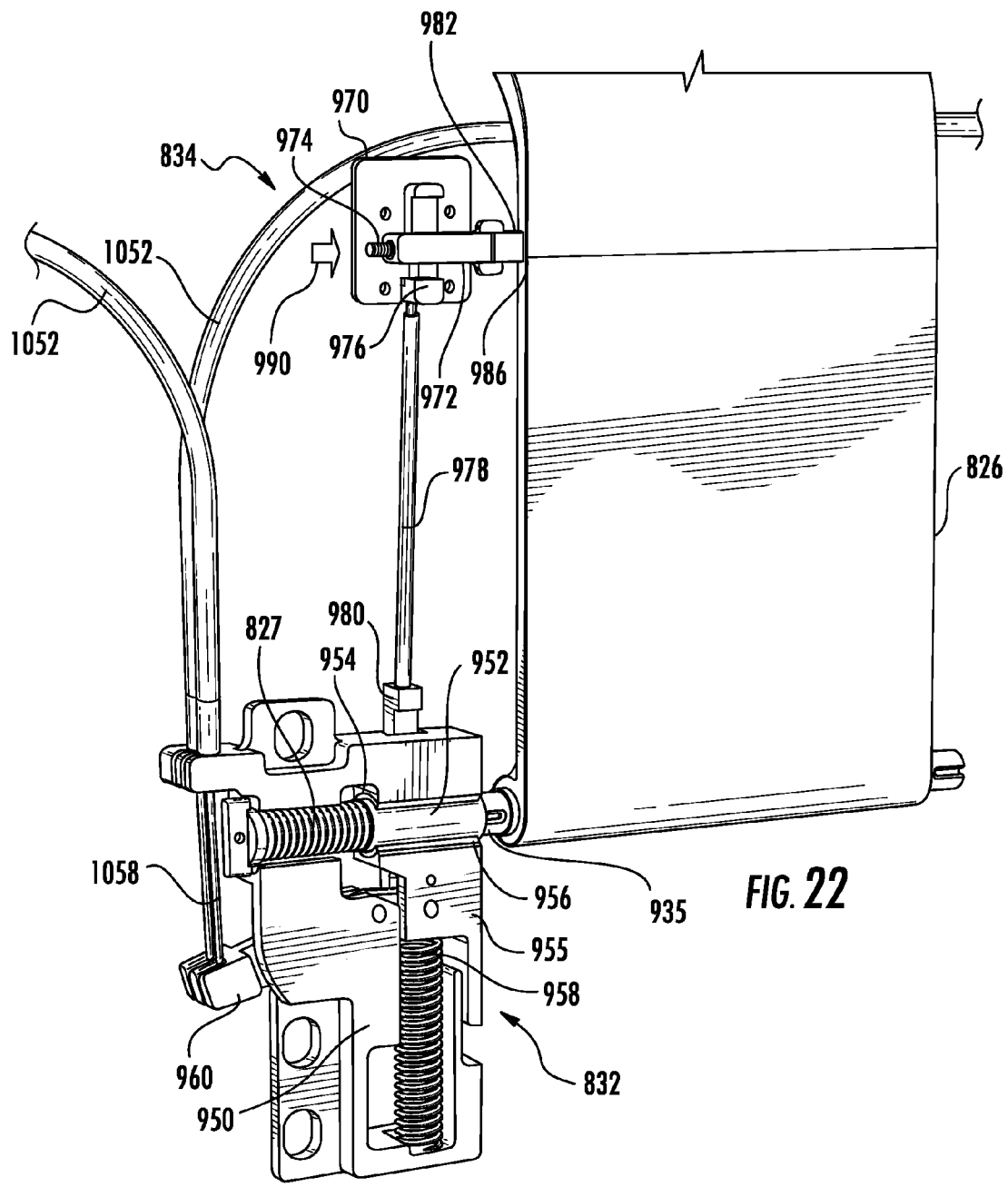
FIG. 22 is a perspective view of the second securement mechanism of FIG. 21 in a securing state.
Figure 23:
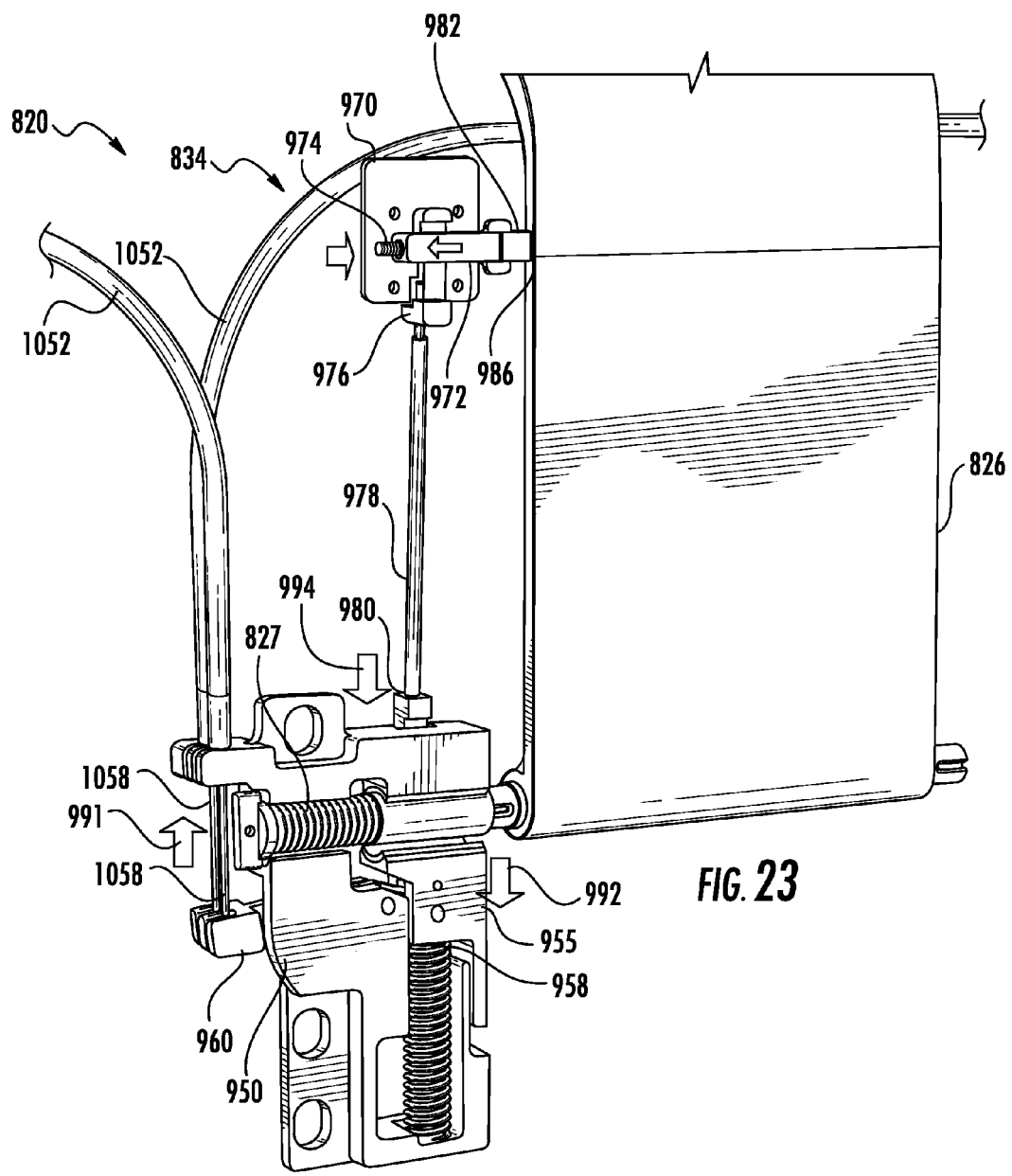
FIG. 23 is a perspective view of the second securement mechanism of FIG. 22 in a released state.

FIGS. 21-23 illustrate the catch assembly of securement mechanism 834 in detail. As shown by FIG. 21, securement mechanism 834 comprises catch capture plate 970, catch horizontal slider 972, bias 974, catch vertical slider 976, catch link rod 978 and catch link rod 980 (shown in FIGS. 22 and 23). Catch capture plate 970 guides and movably supports sliders 972, 976. Catch horizontal slider 972 is slidably supported and guided by capture plate 970. Slider 972 comprises catch 982 and cam follower surface 984. As shown by FIGS. 22 and 23, catch 982 comprises a member configured to project into a corresponding cavity 986 in arm 826 so as to or latch arm 826 when arm 826 is in the fully retracted position. Although illustrated as a tab received within a side of arm 826, in other implementations, catch 982 may alternatively comprise one or more pins, a hook or other structures. In lieu of being received within a side of arm 826, catch 982 may alternatively engage other portions of arm 826 to retain arm 826 in a fully retracted position.

Cam follower surface 984 comprises a surface that interacts with a corresponding cam surface of slider 976 to convert vertical motion of vertical slider 976 to horizontal motion of slider 972. In the example illustrated, cam follower surface 984 comprises an inclined surface or ramp.

Bias 974 comprises a member configured to resiliently bias catch 98 from a catch released position (shown in FIG. 23) towards a catch locked or retaining position (shown in FIG. 22). In the example illustrated, bias 974 comprises a compression spring. In other implementations, bias 974 may comprise other forms of springs operably coupled to slider 972 in other fashions.

Vertical slider 976 comprise a member movably supported by plate 970. Vertical slider 976 is connected to link rod 978 and includes cam surface 986. Cam surface 986 interacts with cam follower service 984 such that vertical movement of slider 976 forces surface 986 against surface 984 to move slider 972 against the force of bias 974 to move catch 982 towards the catch withdrawn or released position. Because sliders 972 and 976 cooperate to convert vertical motion to horizontal motion, catch 982 may be actuated between an arm engaged position and a disengaged catch released position using the same actuation of lever 960 that actuates brake pad 956 from the braking position to the brake released position. In other implementations, sliders 972, 976 may have other configurations or may be omitted or where catch 982 is actuated by other mechanisms or is omitted.

Catch link rod 978 and catch link rod end 980 operably connect or couple slider 976 to lever 960. Catch link rod 978 is connected between vertical slider 976 and catch link and 980. Catch link end 980 extends from rod 978 and is guided by body 952 where end 980 is pivotally pinned to lever 960.

As shown by FIG. 22, in the absence of actuation of actuators 860, bias 974 resiliently urges catch 982 in the direction indicated by arrow 990 into cavity 986. As shown by FIG. 23, in response to lever 960 being pulled in the direction indicated by arrow 991, support 955 is moved downward in the direction indicated by arrow 992 against the bias force of bias 958 to move brake pad 956 to the brake released position. Such downward movement of support 955 likewise causes downward movement of end 980, rod 978 and slider 976 in the direction indicated by arrow 994. As a result, cam surface 986 interacts with cam follower surface 984 of slider 972 to horizontally move slider 972 and catch 982 against the bias force of bias 974 to withdraw catch 982 from cavity 986.

Figure 24:
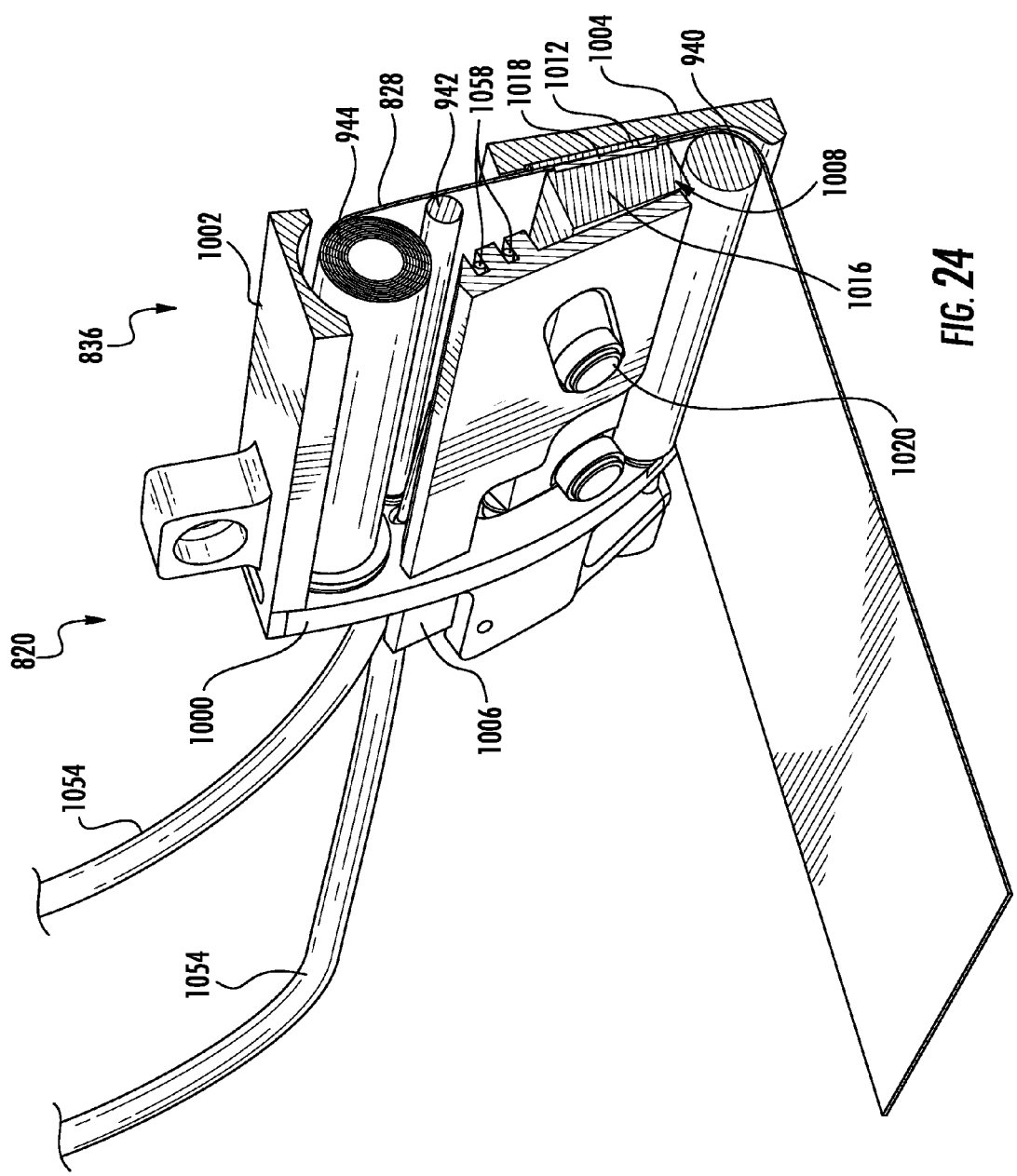
FIG. 24 is a sectional view of an example third securement mechanism of the system of FIG. 18 in a securing state.
Figure 25:
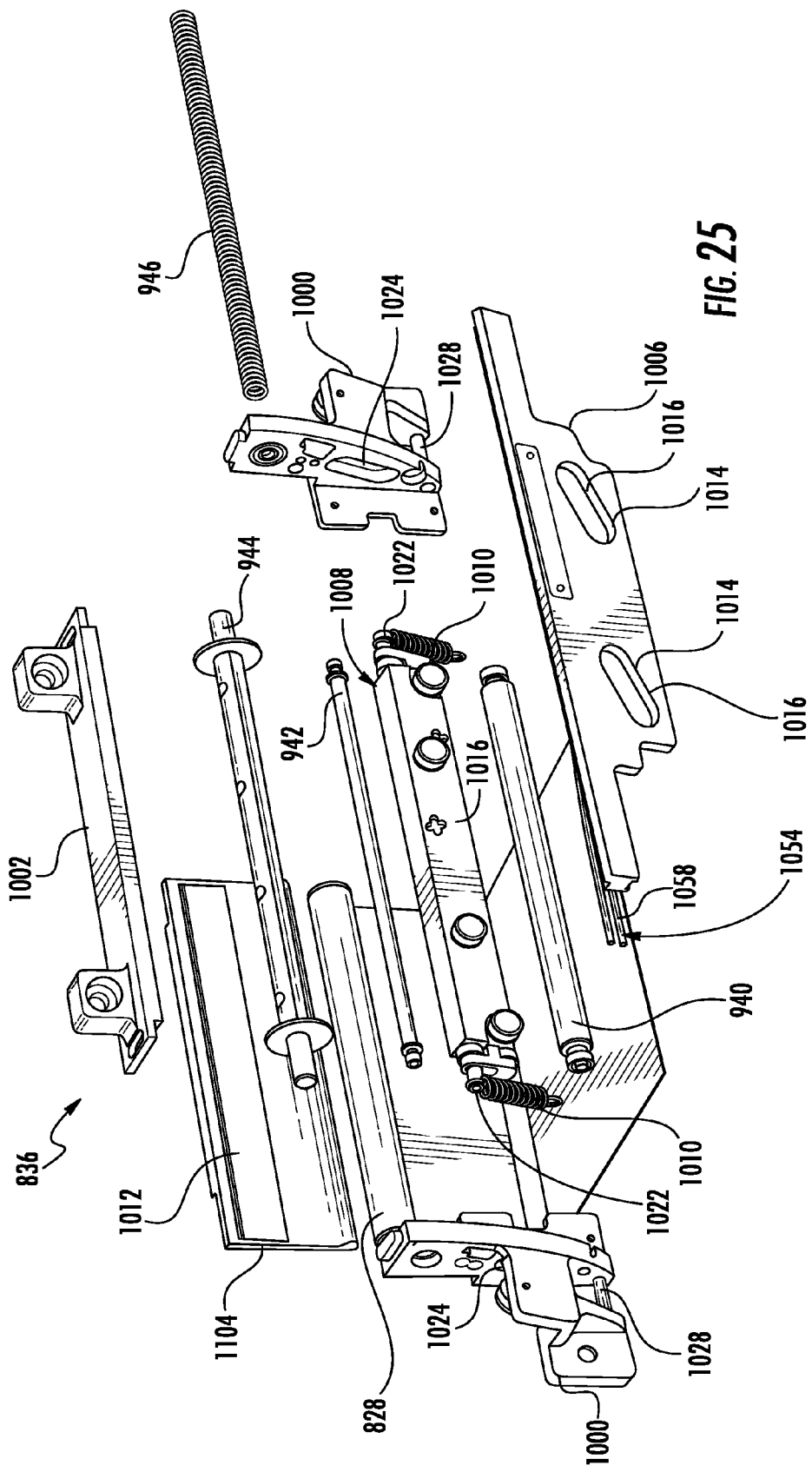
FIG. 25 is an exploded perspective view of the third securement mechanism of FIG. 24.

Securement mechanism 836 comprises a mechanism to selectively grip pliable member 828 to inhibit or allow extension of pliable member 878 from spool 944. As shown by FIGS. 24 and 25, securement mechanism 836 comprises a belt brake subassembly comprising supports 1000, top 1002, brake static plate 1004, brake release bar 1006, brake carriage 1008, and brake return biases 1010. Supports 1000 comprise end members or brackets that support the remaining components of securement mechanism 836. In the example illustrated, supports 1000 rotationally support guides 940, 942 and spool 944. Top 1002 interconnects and joins supports 1000. In other implementations, top 1002 may be integrally formed as a single unitary body with supports 1000. In some implementations, top 1002 may be omitted.

Brake static plate 1004 comprises a plate carrying a static braking surface 1012 which cooperates with brake carriage 1008 to selectively grip and release pliable member 828. Braking surface 1012 is formed from a material having a high coefficient of friction with pliable member 828.

Brake release bar 1006 comprises a member slidably supported and guided by supports 1000 between supports 1000. Brake release bar 1006 is operably coupled to actuators 860 so as to be slid with respect to slots 1000 upon actuation of actuators 860. Brake release bar 1006 comprises angled slots 1014 which provide cam surfaces 1016. Cam surfaces 1016 interact with the brake carriage 1008 to convert motion of release bar 1006 into motion of carriage 1008. Cam surfaces 1016 forces the release and braking movement to be parallel such that bar 1006 acts uniformly across its width.

Belt brake carriage 1008 comprises plate 1016, gripping pad 1018, and cam followers 1020. Plate 1016 carries gripping pad 1018 and cam followers 1020. Gripping pad 1018 includes a pair of oppositely extending posts 1022 which are slidably received within slots 1024 in supports 1000. Slots 1024 guide movement of carriage 1008 and pad 1018 towards and away from surface 1012 in response to movement of release bar 1006.

Gripping pad 1018 (shown in FIGS. 23 and 27) comprises a pad carried by plate 1016 having a high coefficient of friction with pliable member 828. Cam followers 1020 interact with plate 1006 to actuate gripping pad 1018 between a pliable member gripping state and a pliable member released state. In the example illustrated, cam followers 1020 comprise cylindrical rollers that roll within slots 1014. In other implementations, cam followers 1020 may have other configurations for facilitating movement of carriage 1008. Brake return biases 1010 resiliently bias or urge gripping pad 1018 towards gripping surface 1012 and against pliable member 828. In the example illustrated, biases 1010 comprise tension springs having a first end secured to one of posts 1022 and a second end secured to support 1000 at mounting location 1028.

Figure 27:
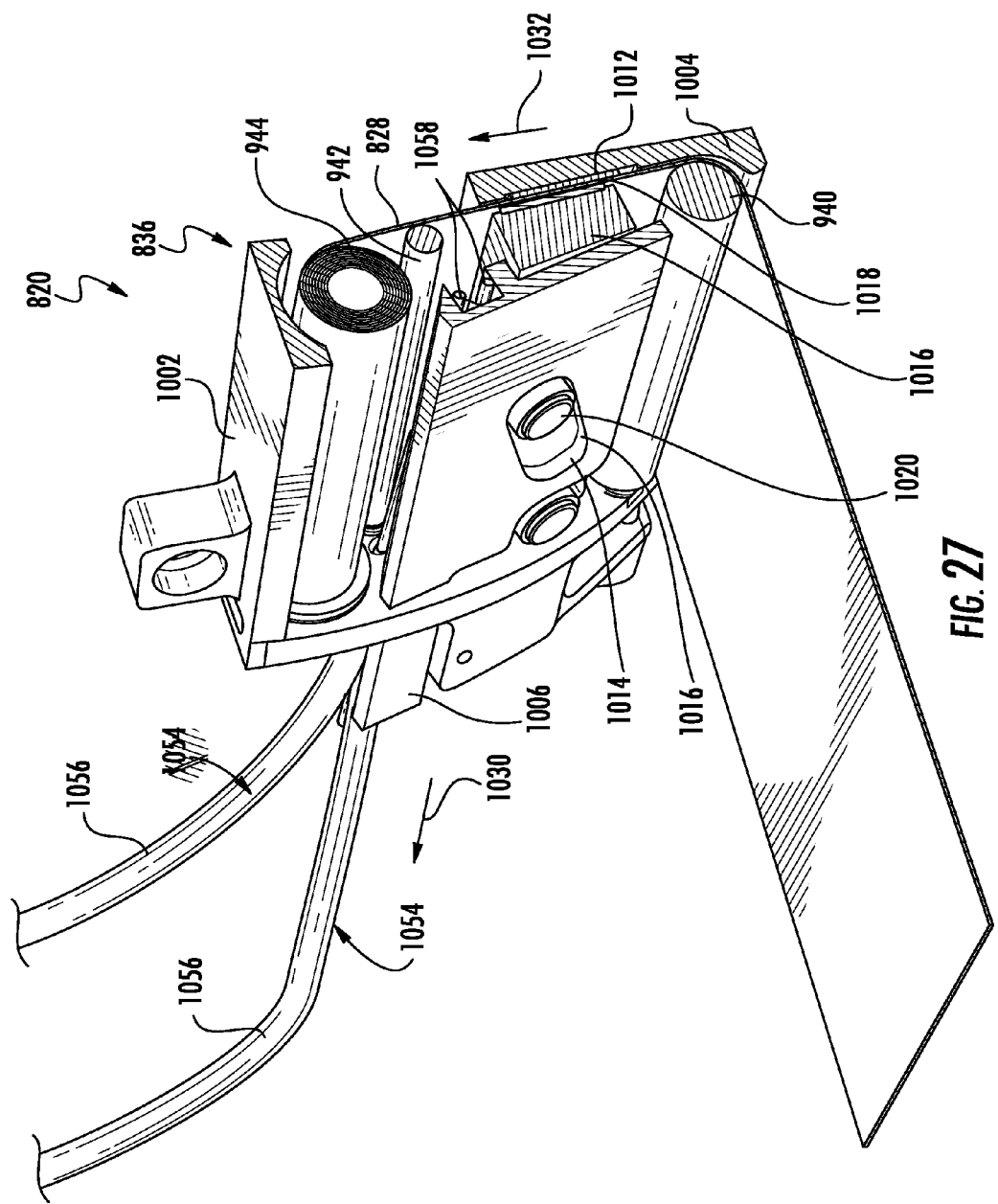
FIG. 27 is a sectional view of the third securement mechanism of FIG. 24 in a released state.

FIGS. 24 and 27 illustrate operation of securement mechanism 836. As shown by FIG. 24, in the absence of actuators 860 being depressed or actuated, biases 1010

Figure 26:
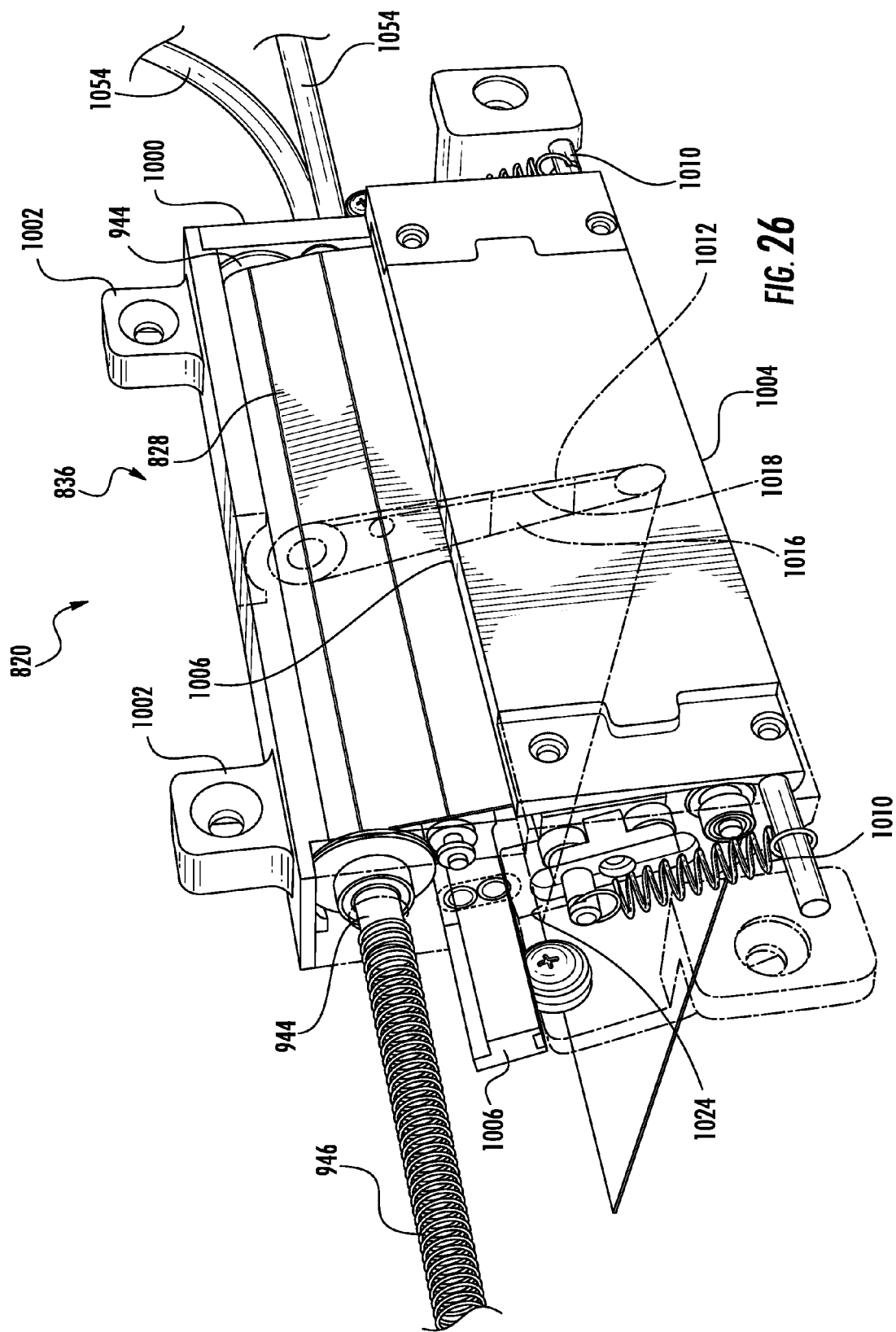
FIG. 26 is an enlarged perspective view of the third securement mechanism of FIG. 18 with portions transparently illustrated for purposes of illustration.

(shown in FIGS. 25 and 26) resiliently urge carriage 1008 and gripping pad 1018 downward (as seen in FIG. 24) into a pliable member pinching relationship with surface 1012 to grip pliable member 828 to inhibit extension of pliable member 828 or extension of pliable member 828 by spool 944. With the operation of the example securement mechanism, increasing pressure on the panel 822 or arm 826 increases the tension in pliable member 828. As a result, the angled inclination of the cam slots 1024 causes the gripping force on the pliable member to also increase. Thus, the braking force is in relation to the force applied to panel 22. Consequently, the spring forces to sufficiently grip pliable member 28 may be lower, allowing actuators 860 to be actuated with less manually applied force.

As shown by FIG. 27, in response to actuation of either of actuators 860 (shown in FIG. 18), release plate 1006 is pulled to the left in the direction indicated by arrow 1030. As a result, cam followers 1020 ride against cam surfaces 1016 to move carriage 1008 in a generally upward direction as indicated by arrow 1032 against the bias force of biases 1010. As a result, gripping pad 1018 is withdrawn away from surface 1012 and away from pliable member 828 to a pliable member grip released state or position, allowing pliable member 828 to be retracted with the assistance of bias 946 or to be extended with the application of manually applied force to arm 936 (the manual application of a counter clockwise torque to arm 936 against the bias of bias 827).

Figure 28:
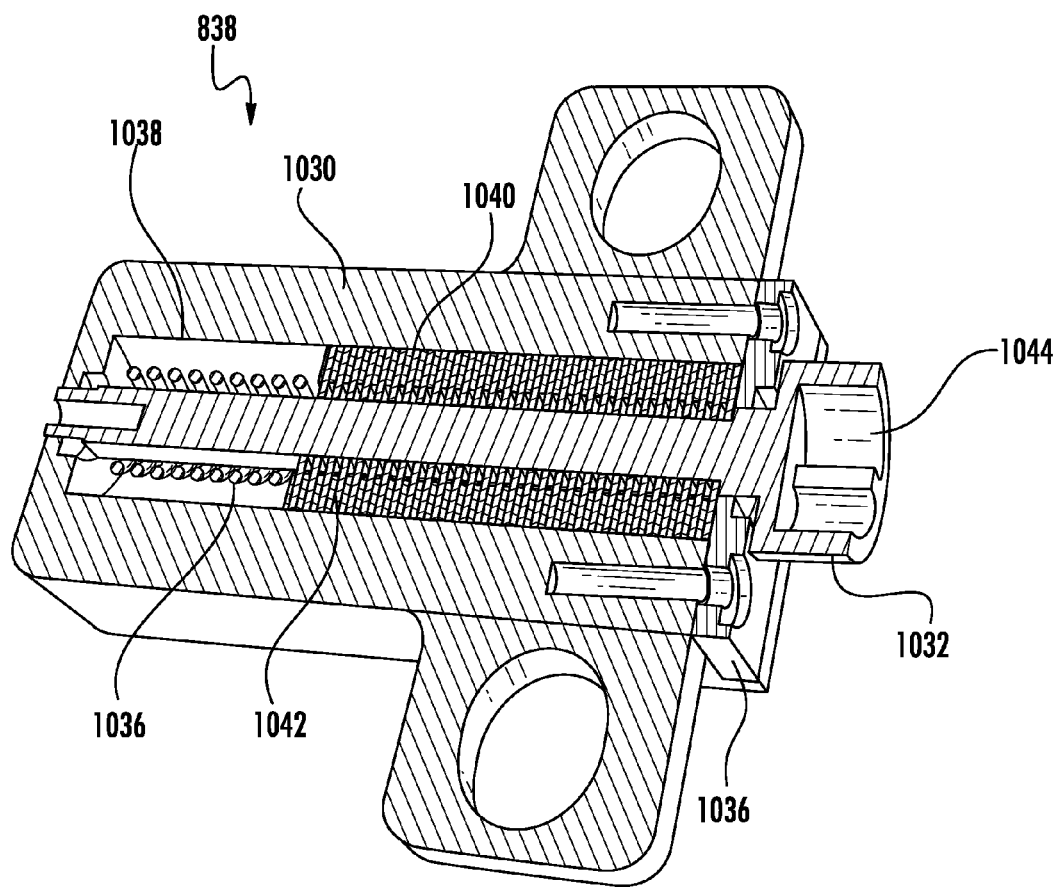
FIG. 28 is a sectional view of an example damping mechanism of the system of FIG. 18.

Dampener 838 comprises a mechanism to reduce the rate at which bias 827 rotates shaft 935 and arm 826 towards a fully retracted position when actuators 860 are being actuated. FIG. 28 is a sectional view illustrating dampener 838 in more detail. As shown by FIG. 28, dampener 838 comprises case 1030, axle 1032, cap 1034, and compression spring 1036. Case 1030 forms an interior passage 1038 which receives Axle 1032. Case 1030 further comprises a plurality of fins 1040 which are interleaved with fins 1042 extending from axle 1032. Axle 1032 has an end 1044 receiving and non-rotationally fixed to axle 935. Clap 1034 closes passage 1038 and assisted rotationally supporting axle 1032. Cap 1034 further contains dampening grease provided within passage 1038 between fins 1040, 1042. Compression spring 1036 resiliently urges the vanes or fins 1040, 1042 together. In other implementations, dampening mechanism 838 may have other configurations. In some implementations, dampening mechanism 838 may be omitted.

Actuators 860 comprise mechanisms to transmit manual force applied by a person to securement mechanisms 832, 834 and 836 to allow movement of arm 826 when orienting panel 822 at a desired angular orientation or tilt. As shown by FIG. 18, in the example illustrated, system 820 comprises two actuators 860 on opposite sides of panel 822. Each actuator 860 operates independent of the other actuator 860. Each actuator 860 is coupled to each of securement mechanisms 832, 834 and 836 such that actuation of only one of actuators 860 is sufficient to release all of securement mechanisms 832, 834 and 836 to allow movement of arm 826. As a result, system 820 accommodates different preferences of different persons for the location of the releasing actuator 860. In other implementations, system 820 may alternatively include a single actuator 860 or greater than two actuators 860. In yet other implementations, system 820 may include two or more actuators 860, wherein each of such actuators 860 releases less than all of securement mechanisms 832, 834 and 836 such that at least two of the actuators 860 must be actuated to release securement mechanisms 832, 834 and 836. In circumstances where arm 826 is not in a fully retracted position such that catch 982 is not in catching engagement arm 826 even though catch 982 may be extended, movement of arm 826 may be facilitated without release of securement mechanism 834.

In the example illustrated, each of actuators 860 comprises a paddle assembly 1050 operably connected to securement mechanisms 832, 834 and 836 by force transmitting mechanisms 1052, 1054. In the example illustrated, such force transmitting mechanisms 1052, 1050 for each comprise a Bowden cable. Each Bowden cable comprises an outer sheath 1056 or guiding an internal cable or wire 1058 slides within the outer sheath 1056. As shown by FIGS. 18 and 20, wires 1058 of force transmitting mechanisms 1052 are connected to an end of lever 960 for applying force to lever 962 release mechanisms 832 and 834. As shown by FIGS. 25 and 27, wires 1058 of force transmitting mechanisms 1054 are secured to release bar 1006. In other implementations, other force transmitting mechanisms may be utilized to transmit force from paddle assemblies 1050 to securement mechanisms 832, 834 and 836. For example, in lieu of such wires 1058, link rod levers or hydraulic and pneumatic transmission lines may be utilized or gear and cam based transmissions may be employed. In yet other implementations, powered actuators such as motors and solenoids (and associated cams, gears and linkages) may be actuated in response to a manual input to release securement mechanisms 832, 834 and 836.

Figure 29:
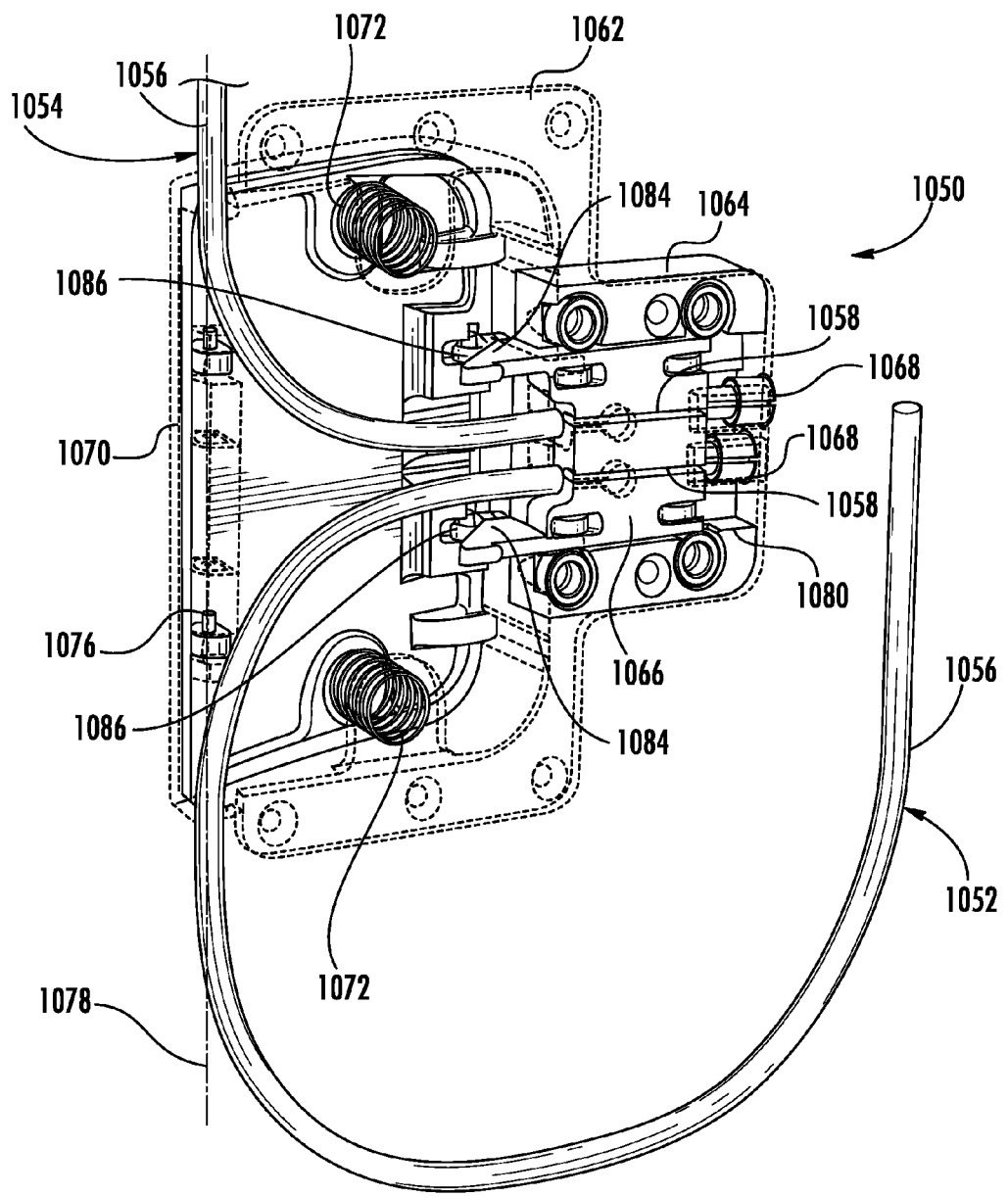
FIG. 29 is a rear perspective view of an example actuator of the system of FIG. 18 in an un-actuated state with portions transparently shown for purposes of illustration.
Figure 30:
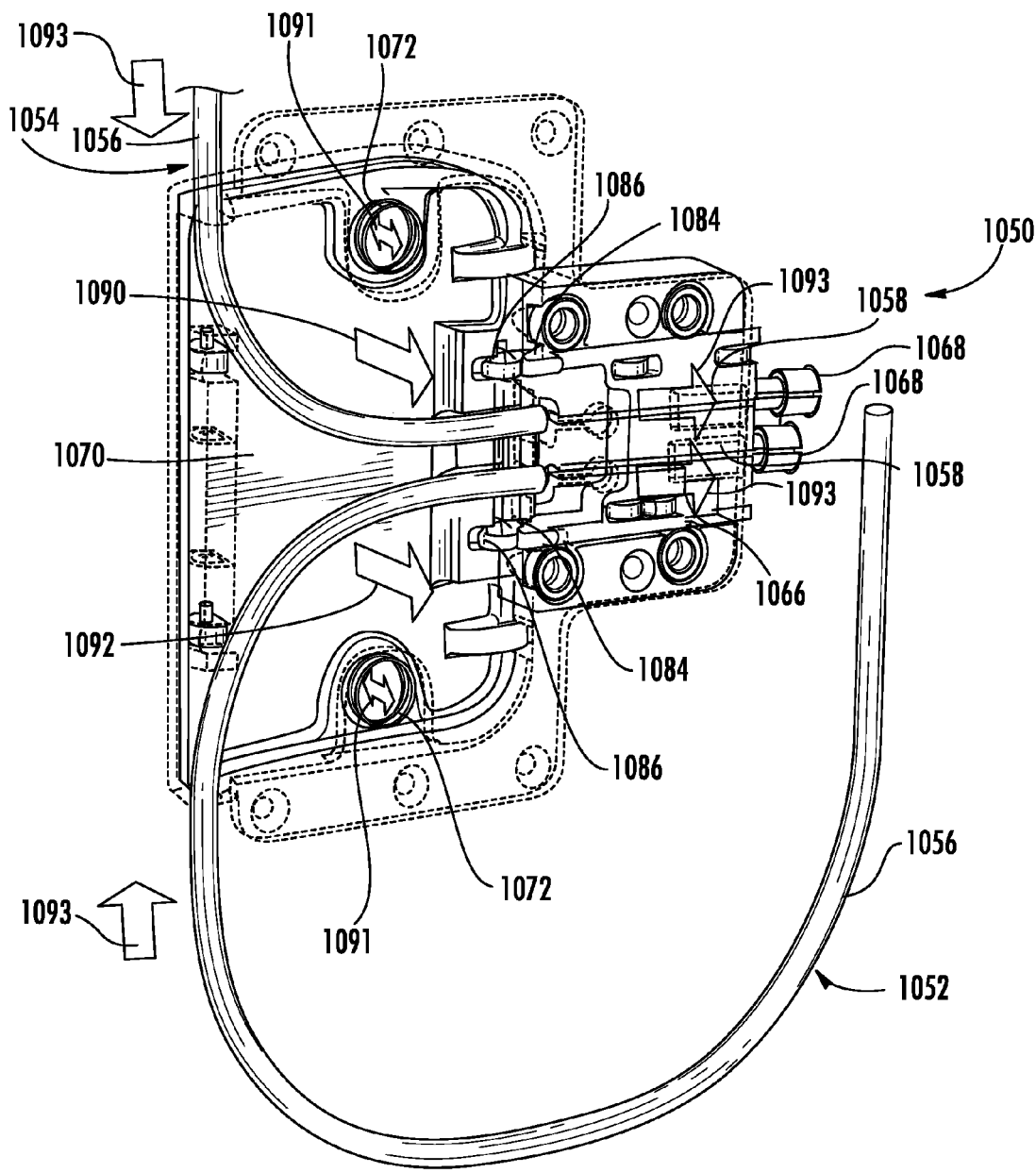
FIG. 30 is a rear perspective view of the actuator of FIG. 29 in an actuated state.

FIGS. 29 and 30 illustrate an example of each of paddle assemblies 1050. FIG. 29 illustrates paddle assembly 1050 in an unactuated state such that securement mechanisms 832, 834 and 836 are all in securing states (unless the other of paddle assembly 150 is being actuated). As shown by FIG. 29, paddle assembly 1050 comprises paddle surround 1062, paddle carriage trap 1064, paddle carriage 1066, paddle screw adjusts 1068, paddle 1070 and return springs 1072.

Paddle surround 1062 comprises the base structure supporting a remainder of paddle assembly 1050. Paddle surround 162 movably supports paddle 1070 or guiding paddle 1070. In the example illustrated, paddle support 1062 pivotably supports paddle 1070 for pivotal movement about posts 1076 and about axis 1078.

Paddle carriage trap 1064 is coupled to paddle support 1062 and includes a channel or passage 1080 for guiding sliding movement of carriage 1066. Paddle screw adjusts 1068 comprise beads adjustably secured to ends of wires 1058 of force transmission mechanisms 1052 and 1054. Paddle screw adjusts 1068 are configured to be adjustably positioned along wires 1058 to adjust a length of wires 1058 extending from adjusts 1068. In other implementations, adjusts 1068 may be omitted or may be beads that are not adjustable.

Paddle carriage 1066 comprise a structure slidable within passage 1080 of trap 1064 to move adjusts 1068 so as to move or pull wires 1058. Carriage 1066 extends between sheath 1056 and adjusts 1068 with wires 1058 extending through carriage 1066. In other implementations, wires 1058 may be fixed to carriage 1066 in other manners. Carriage 1066 includes cam follower surfaces 1084 configured to interact with cam surfaces of paddle 1072 move carriage 1066 in response to actuation of paddle 1070. In the example illustrated, cam surfaces 1084 comprise inclined or ramped surfaces.

Paddle 1070 comprises a member providing a surface which may be depressed by a person. Paddle 1070 includes cam surfaces 2086 which interact with cam follower surfaces 1084 to convert movement of paddle 170 into movement of carriage 1066 such that wires 1058 are pulled. In the example illustrated, cam surfaces 1086 comprise rollers or wheels rotationally supported by paddle 1070 in engagement with cam follower surfaces 1084.

Return springs 1072 comprise compression spring captured between paddle surround 1062 and an underside of paddle 1070. Return springs 1072 keep or return the paddle 1070 pushed flush to a 'start position' flush with the rear surface regardless of the carriage position.

FIG. 30 illustrates depressment or actuation of paddle 1070. As indicated by arrow 1090, paddle 1070 is depressed against the bias of return springs 1072 (as indicated by arrow 1091). Depressment of paddle 1070 results in movement of cams 1086 against cam follower surfaces 1084 to move carriage 1066 in the direction indicated by arrow 1092. As indicated by arrows 1093, depressment of paddle 1070 results in wires 1058 of each of force transmitting mechanisms 1052, 1054 being pulled which releases each of securement mechanisms 832, 834 and 836 (discussed above). Upon cessation of the depressment of paddle 1070, return springs 1072 return paddle 1070, allowing carriage 1066 to return to its initial state and allowing wires 1058 to be drawn back through sheaths 1056. As a result, the biases of securement mechanisms 832, 834 836 resiliently return each of the securement mechanisms to their default arm and pliable member securing states.

Figure 31:
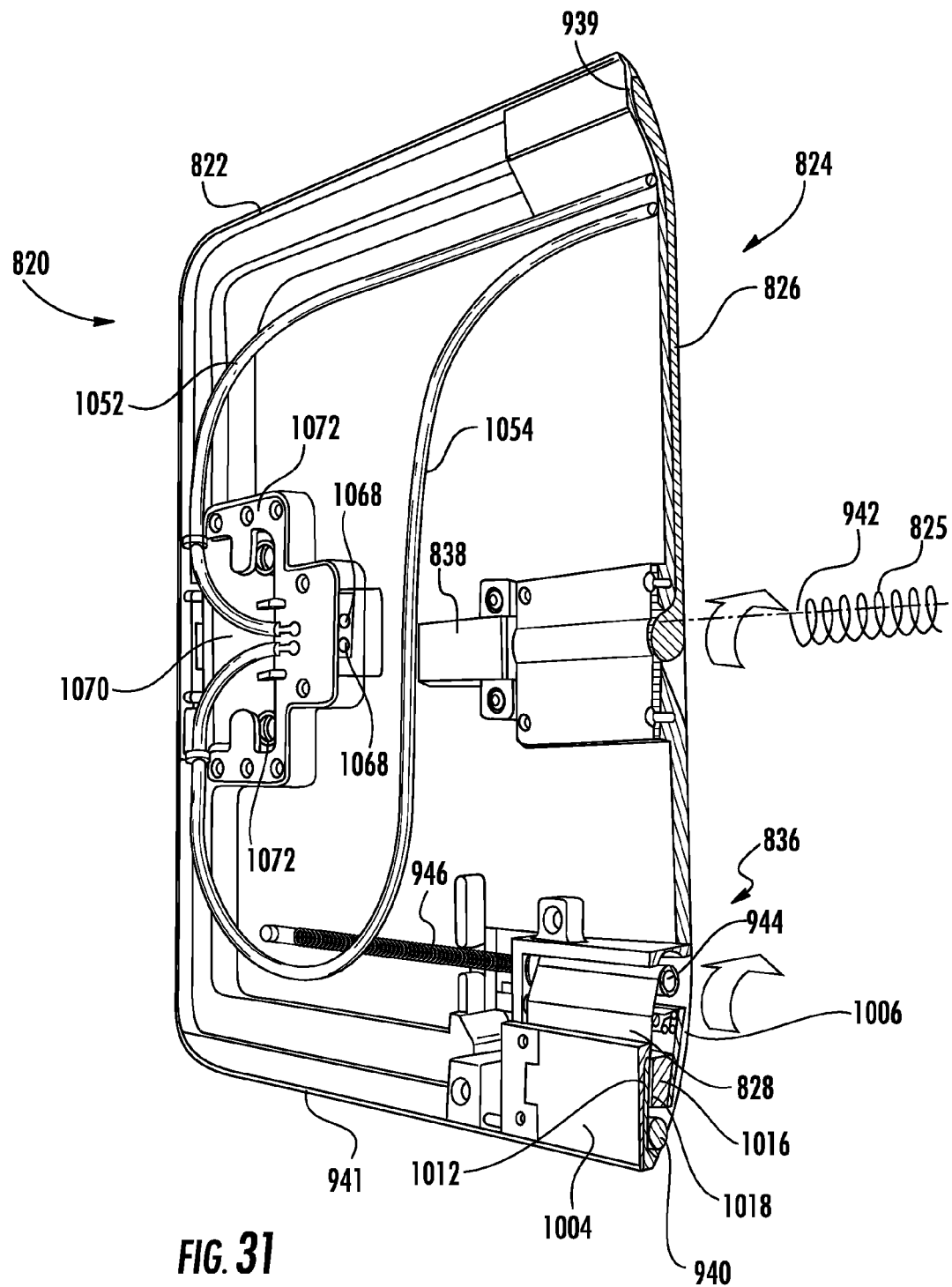
FIG. 31 is a sectional view of the system of FIG. 18 with an arm a fully retracted.
Figure 32:
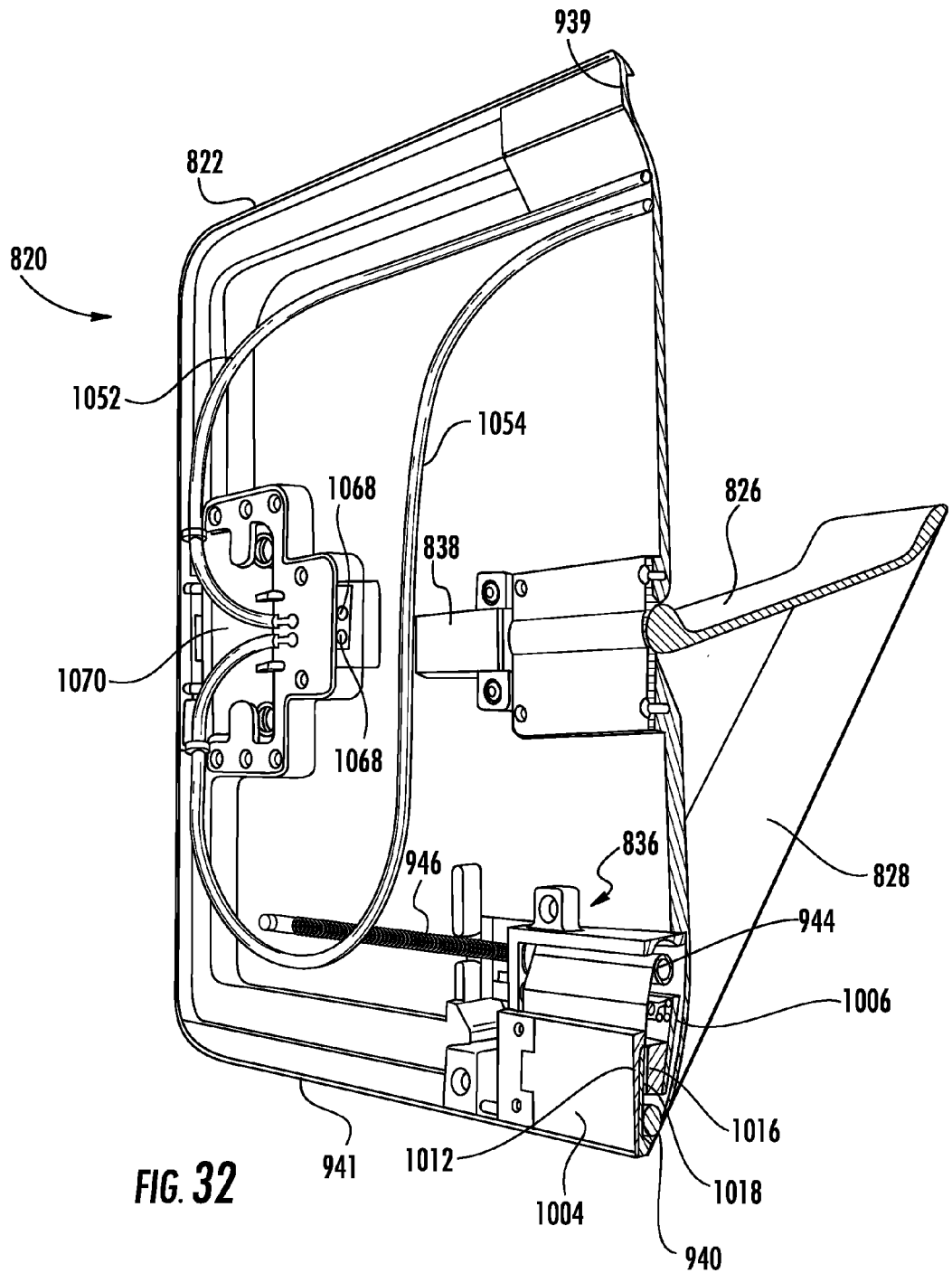
FIG. 32 is a sectional view of the system of FIG. 18 with the arm in a first extended position.
Figure 33:
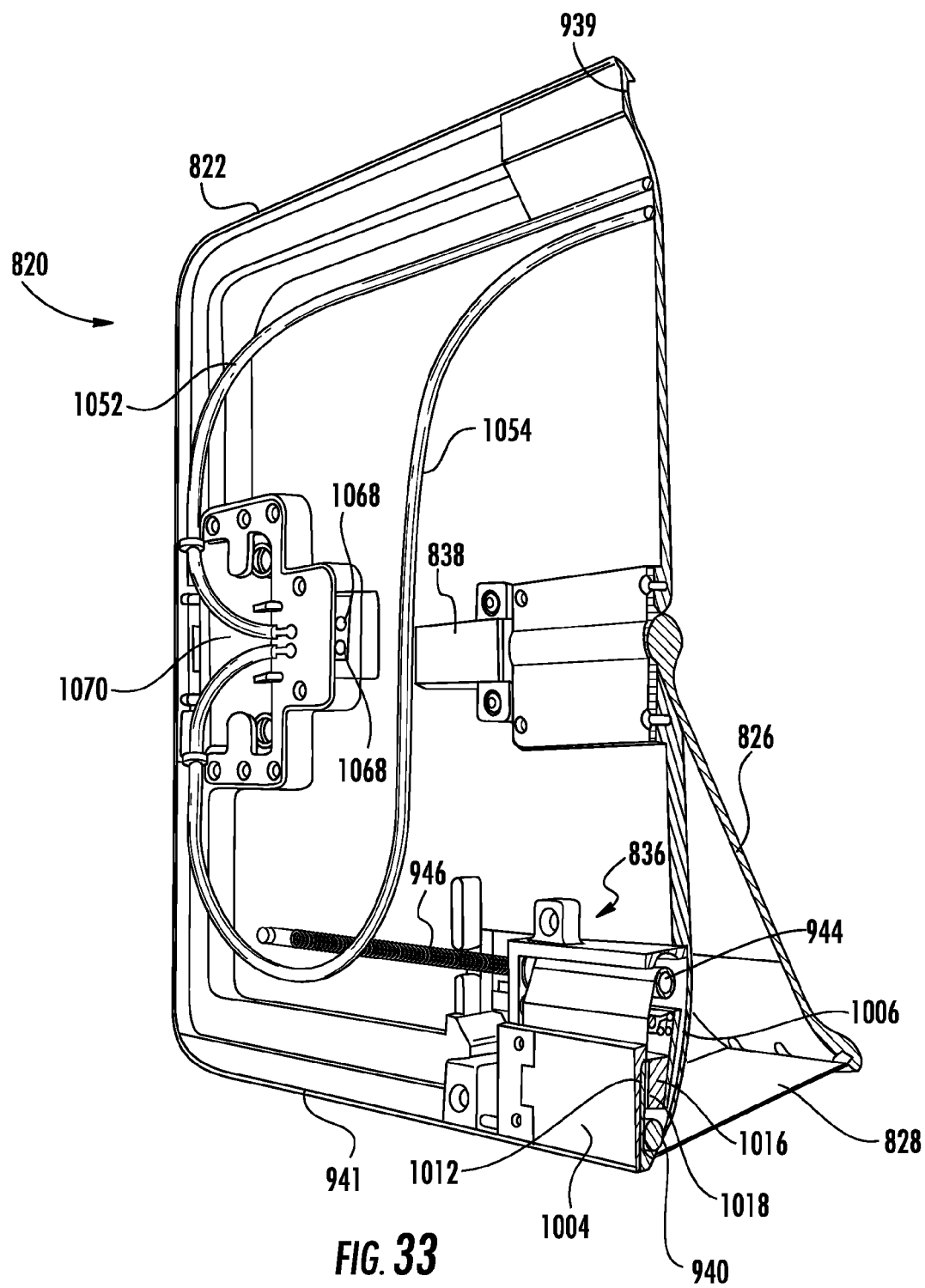
FIG. 33 is a sectional view of the system of FIG. 18 with the arm in a second extended position.

FIGS. 18 and 31-33 illustrate the overall operation of support 824. FIG. 31 illustrates arm 826 retained in a fully retracted position within cavity 940, wherein catch 982 of securement mechanism 834 (shown in FIG. 22) retains arm 826 in the fully retracted position. FIGS. 32 and 33 illustrate release of securement mechanisms 832, 834 and 836, allowing arm 826 to be extended to a first angular position shown in FIG. 32 and to be further extended to a second angular position shown in FIG. 33. Retention of arm 826 and one of the selected extended positions achieved by the person merely releasing paddle 1070 (shown in FIG. 18).

As shown by FIG. 18 and indicated arrows 1100, to move arm 826 to a more extended position (such as from the position shown in FIG. 31 to either of the positions shown in FIG. 32 or 33), a person presses paddle 1070 against the bias of return springs 1072. Such depressment results in carriage 1066 pulling wires 1058 (as shown in FIG. 30) of force transmitting mechanisms 1052, 1054 (as indicated by arrows 1102). The pulling of wires 1058 results in securement mechanism 836 being first released as compared to securement mechanisms 832 and 834. In particular, as indicated by arrow 1104, release bar 1006 is pulled sideways, wherein cam surfaces 1016 interact with cam followers 1020 to lift carriage 1008 (as indicated by arrow 1106) against biases 1010 (represented by arrows 1108) and to move pad 1018 out of pinching relationship with respect to pliable member 828. As indicated by arrow 1110, bias 946 and bias 827 act trying to retract pliable member 828, but securement mechanism 832 is sufficiently strong to brake rotation of arm 826 to resist retraction of pliable member 828. Upon release of securement mechanism 836, securement mechanisms 832 and 834 are released (due to the different lengths of wires 1058 and the different distances that such wires be pulled to release such mechanisms. Because securement mechanism 836 is released prior to the release of securement mechanisms 832 and 834, the creation of slack within pliable member 828 is inhibited. Release of securement mechanism 832 and 834 allows arm 826 free to rotate, powered by bias 827 and bias 946 until depressment of paddle 1070 is terminated or until arm 826 touches a supporting surface. Release of paddle 1070 causes the reverse sequence, wherein tension in pliable member 828 resists any closing force on arm 826, and wherein as greater force is applied to panel 822, a greater clamping force is applied to plate 1016 and ultimately back to pliable member 828.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
   a panel;
   a support coupled to the panel, the support comprising:
      an arm having a first portion coupled to the panel and a second portion movable to an extended panel supporting position;
      a pliable member extending from the panel and coupled to the arm; and
      a take up mechanism to take up the pliable member to maintain the pliable member at tension when the arm is at different positions.

2. The apparatus of claim 1, wherein the pliable member is actuatable between a shortened position in which a first percentage of the pliable member extends from an interior of the panel and a lengthened position in which a second percentage of the pliable member greater than the first percentage is extended from the interior of the panel.

3. The apparatus of claim 1, wherein the pliable member has a first percentage extending from an interior of the panel when the arm is in the extended position and a second percentage greater than the first percentage extending from the panel when the arm is in a retracted position.

4. The apparatus of claim 1, wherein the take-up mechanism comprises a bias resiliently pulling the pliable member into an interior of the panel.

5. The apparatus of claim 4 further comprising a shaft coupled to the pliable member, wherein the bias applies a torque to the shaft to wind the pliable member about the shaft.

6. The apparatus of claim 4, wherein the bias resiliently biases the arm towards the extended panel supporting position.

7. The apparatus of claim 1, wherein the arm is pivotable about an axis and wherein the pliable member is extendable across the axis from below the axis to above the axis when the panel is supported by the arm in a vertical orientation.

8. The apparatus of claim 1 comprising a dampening mechanism coupled to the arm to dampen rotation of the arm towards the extended position.

9. The apparatus of claim 1 comprising:
   a catch movable between an arm latching position in which the catch retains the arm in a retracted position and an arm unlatched position, wherein the catch is resiliently biased towards the arm latching position; and a manual actuator coupled to the catch to move the catch towards the arm unlatching position.

10. The apparatus of claim 9 comprising:

a brake coupled to the arm and movable between a braking position in which the brake inhibits rotation of the arm and a released position allowing the arm to rotate, wherein the brake is resiliently biased towards the braking position; and a manual actuator coupled to the brake to move the brake towards the released position.

11. The apparatus of claim 1 comprising:

a brake coupled to the arm and movable between a braking position in which the brake inhibits rotation of the arm and a brake releasing position allowing the arm to rotate, wherein the brake is resiliently biased towards the braking position; and a manual actuator coupled to the brake to move the brake towards the brake releasing position.

12. The apparatus of claim 1 comprising:

a gripping mechanism actuatable between a gripping position in which the pliable member is gripped to inhibit extension of the pliable member from the panel and a grip releasing position allowing the pliable member to be extended from the panel, wherein the gripping mechanism is resiliently biased towards the gripping position; and a manual actuator coupled to the gripping mechanism to move the gripping mechanism towards the grip releasing position.

13. The apparatus of claim 1, wherein the pliable member is actuatable between a shortened position in which a first percentage of the pliable member extends from the panel and a lengthened position in which a second percentage of the pliable member greater than the first percentage is extended from the panel and wherein the apparatus further comprises:

at least one pliable member securement mechanism to secure the pliable member against actuation from the shortened position to the lengthened position;

a first manual actuator at a first portion of the panel and operatively coupled to the at least one pliable member securement mechanism;

a second manual actuator at a second portion of the panel spaced from the first portion of the panel, the second manual actuator being operably coupled to the at least one pliable member securement mechanism, wherein actuation of either the first manual actuator or the second manual actuator releases the at least one securement mechanism to allow the pliable member to be actuated from the shortened position to the lengthened position.

14. A method for supporting an electronic display panel, the method comprising:

moving a panel supporting arm coupled to the panel to an extended position;

extending a pliable member from the panel to the panel supporting arm; and taking up the pliable member when the electronic display panel is in different positions.

* * * * *